(12) United States Patent
Cohen et al.

(10) Patent No.: US 9,397,195 B2
(45) Date of Patent: Jul. 19, 2016

(54) GRAPHENE NANORIBBONS AND CARBON NANOTUBES FABRICATED FROM SIC FINS OR NANOWIRE TEMPLATES

(71) Applicant: GLOBALFOUNDRIES INC., Grand Cayman (KY)

(72) Inventors: Guy Cohen, Mohegan Lake, NY (US); Christos D. Dimitrakopoulos, Baldwin Place, NY (US); Alfred Grill, White Plains, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/064,830

(22) Filed: Oct. 28, 2013

(65) Prior Publication Data
US 2014/0048774 A1 Feb. 20, 2014

Related U.S. Application Data

(62) Division of application No. 13/088,766, filed on Apr. 18, 2011, now Pat. No. 8,642,996.

(51) Int. Cl.
*H01L 29/775* (2006.01)
*H01L 29/66* (2006.01)
(Continued)

(52) U.S. Cl.
CPC ............ *H01L 29/66795* (2013.01); *B82Y 10/00* (2013.01); *B82Y 40/00* (2013.01); *H01L 21/02057* (2013.01); *H01L 21/02381* (2013.01); *H01L 21/02527* (2013.01);
(Continued)

(58) Field of Classification Search
CPC ............ H01L 29/775; H01L 29/66742; H01L 29/0673; H01L 29/785; H01L 29/1025; H01L 29/1606; B82Y 99/00; B82Y 40/00; B82Y 10/00
USPC ...................................... 257/29; 977/734, 742
See application file for complete search history.

(56) References Cited

U.S. PATENT DOCUMENTS

| 6,413,802 B1 | 7/2002 | Hu et al. |
| 7,083,104 B1 | 8/2006 | Empedocles et al. |

(Continued)

FOREIGN PATENT DOCUMENTS

CN 101252148 A 8/2008

OTHER PUBLICATIONS

Great Britain Office Action dated Oct. 23, 2014 from Great Britain Application No. GB 1318578.0.
(Continued)

*Primary Examiner* — Cuong Q Nguyen
(74) *Attorney, Agent, or Firm* — Scully, Scott, Murphy & Presser, P.C.

(57) ABSTRACT

Semiconductor structures including parallel graphene nanoribbons or carbon nanotubes oriented along crystallographic directions are provided from a template of silicon carbide (SiC) fins or nanowires. The SiC fins or nanowires are first provided and then graphene nanoribbons or carbon nanotubes are formed on the exposed surfaces of the fin or the nanowires by annealing. In embodiments in which closed carbon nanotubes are formed, the nanowires are suspended prior to annealing. The location, orientation and chirality of the graphene nanoribbons and the carbon nanotubes that are provided are determined by the corresponding silicon carbide fins and nanowires from which they are formed.

17 Claims, 15 Drawing Sheets

(51) Int. Cl.
| | |
|---|---|
| *H01L 21/3105* | (2006.01) |
| *H01L 21/306* | (2006.01) |
| *H01L 21/02* | (2006.01) |
| *H01L 21/324* | (2006.01) |
| *B82Y 10/00* | (2011.01) |
| *B82Y 40/00* | (2011.01) |
| *H01L 29/06* | (2006.01) |
| *H01L 29/10* | (2006.01) |
| *H01L 29/16* | (2006.01) |
| *H01L 51/00* | (2006.01) |
| *H01L 21/28* | (2006.01) |
| *H01L 29/78* | (2006.01) |
| *H01L 51/05* | (2006.01) |
| *B82Y 99/00* | (2011.01) |

(52) U.S. Cl.
CPC ... *H01L 21/02529* (2013.01); *H01L 21/02636* (2013.01); *H01L 21/28008* (2013.01); *H01L 21/30604* (2013.01); *H01L 21/31051* (2013.01); *H01L 21/324* (2013.01); *H01L 29/0673* (2013.01); *H01L 29/1025* (2013.01); *H01L 29/1606* (2013.01); *H01L 29/66439* (2013.01); *H01L 29/66742* (2013.01); *H01L 29/775* (2013.01); *H01L 51/0045* (2013.01); *H01L 51/0048* (2013.01); *B82Y 99/00* (2013.01); *H01L 29/66787* (2013.01); *H01L 29/785* (2013.01); *H01L 51/0558* (2013.01)

(56) References Cited

U.S. PATENT DOCUMENTS

| | | | |
|---|---|---|---|
| 8,076,204 | B2 | 12/2011 | Anderson et al. |
| 8,106,383 | B2 | 1/2012 | Jenkins et al. |
| 8,815,683 | B2 | 8/2014 | Kim et al. |
| 9,306,028 | B2 | 4/2016 | Chen |
| 2005/0263795 | A1 | 12/2005 | Choi et al. |
| 2009/0020764 | A1* | 1/2009 | Anderson et al. ............... 257/77 |
| 2010/0055388 | A1 | 3/2010 | Chen et al. |
| 2010/0200840 | A1* | 8/2010 | Anderson ........... H01L 29/1606 257/29 |
| 2011/0079829 | A1 | 4/2011 | Lai et al. |
| 2011/0127493 | A1 | 6/2011 | Cabral et al. |
| 2011/0253983 | A1 | 10/2011 | Chen et al. |
| 2012/0141799 | A1 | 6/2012 | Kub et al. |

OTHER PUBLICATIONS

First, P. N., et al., "Epitaxial Graphenes on Silicon Carbide", MRS Bulletin, Apr. 2010, 35, entire document especially Abstract, pp. 296-305.

International Search Report and Written Opinion dated Aug. 31, 2012 received in a corresponding foreign application.

Notice of Allowance dated May 11, 2015 received in U.S. Appl. No. 14/064,791.

German Office Action dated Jul. 9, 2015 received in a corresponding foreign application.

Notice of Allowance dated May 10, 2016 received in U.S. Appl. No. 14/810,017.

* cited by examiner

GRAPHENE NANORIBBONS AND CARBON NANOTUBES FABRICATED FROM SiC FINS OR NANOWIRE TEMPLATES

CROSS REFERENCE TO RELATED APPLICATION

This application is a divisional of U.S. patent application Ser. No. 13/088,766, filed Apr. 18, 2011 the entire content and disclosure of which is incorporated herein by reference.

STATEMENT OF GOVERNMENT INTEREST

The present disclosure was made with Government support under Contract No.: FA8650-08-C-7838 awarded by the Defense Advanced Research Projects Agency (DARPA). The Government thus has certain rights to this disclosure.

BACKGROUND

The present disclosure relates to semiconductor structures and methods of fabricating the same. More particularly, the present disclosure relates to semiconductor structures including parallel graphene nanoribbons or carbon nanotubes, which can be used as device channels, oriented along crystallographic directions. The present disclosure also relates to methods of making such semiconductor structures in which the graphene nanoribbons or carbon nanotubes are fabricated from a template of silicon carbide (SiC) fins or nanowires.

In the semiconductor industry there is a continuing trend toward fabricating integrated circuits (ICs) with higher densities. To achieve higher densities, there has been, and continues to be, efforts toward down scaling the dimensions of the devices on semiconductor wafers generally produced from bulk silicon or silicon-on-insulator (SOI). These trends are pushing the current technology to its limits.

Very Large Scale Integrated (VLSI) circuits are typically realized with Metal Oxide Semiconductor Field Effect Transistors (MOSFETs). As the length of the MOSFET gate is reduced, there is a need to thin the SOI body (channel) so the device maintains good short channel characteristics. Adding a second gate opposite the first gate, so the channel is controlled from both opposite faces of the SOI body allows additional scaling of the gate length. The best short channel control is achieved when a gate-all-around the channel is used.

In view of the above, the semiconductor industry is pursuing graphene to achieve some of the aforementioned goals. Graphene, which is essentially a flat sheet of carbon atoms, is a promising material for radio frequency (RF) transistors and other electronic transistors. Typical RF transistors are made from silicon or more expensive semiconductors such as, for example, indium phosphide (InP). The measured mobility of electrons in graphene was found to be much higher than for InP or for silicon.

With all its excellent electronic properties, graphene is missing a bandgap, making it unsuitable for fabrication of digital devices. Transistors fabricated using graphene in the channel would have $I_{on}/I_{off}$ ratios of the order of 10 or less, with many more orders of magnitude ($I_{on}/I_{off}$ of approximately $10^6$) still required for proper function of such devices. It has been shown that bandgaps can be created in graphene if fabricated in the form of nanoribbons or a closed carbon nanotube (CNT). The size of the bandgap increases with decreasing width of the nanoribbon and for potential practical application the width of the graphene nanoribbons (GNR) has to be less than 10 nm, preferably less than 5 nm.

Fabrication of GNR has been demonstrated before on exfoliated graphene nanoflakes. The prior art for fabrication of GNR is based on patterning and etching, usually by RIE, of the graphene layer. Such techniques form nanoribbons with non-uniform and potentially damaged edges, forming line edge roughness, LER, which deteriorates the electrical quality of the GNR.

CNT field effect transistors are known to have excellent characteristics however accurate placement of the CNTs required for making a very large integrated circuit is very challenging. While some progress has been made by oriented growth of CNTs, the achievable CNT to CNT pitch is of the order of a micron. As a benchmark, present day devices are made with a pitch of 50 nm (0.05 microns).

SUMMARY

The present disclosure addresses the FET scaling requirements by using graphene as the channel material. The use of a graphene sheet allows to fabricate a channel that is thinner than can be made today with SOI. Additionally, the devices disclosed in the present disclosure have a double gate to further push scaling. Use of CNT channels, which can be thought as rolled up graphene, allows the fabrication of gate-all-around devices.

The present disclosure describes the fabrication of semiconductor structures including parallel graphene nanoribbons or carbon nanotubes oriented along crystallographic directions. The achievable integration density is equivalent to that obtained in state-of-the-art silicon technology since the graphene nanoribbons or carbon nanotubes are fabricated from a template of silicon carbide (SiC) fins or nanowires.

In the present disclosure, SiC fins or nanowires are first provided and then graphene nanoribbons or carbon nanotubes are formed on exposed surfaces of the fins or the nanowires by annealing. In embodiments in which closed carbon nanotubes are formed, the nanowires are suspended prior to annealing. The location, orientation and chirality of the graphene nanoribbons and the carbon nanotubes that are provided in the present disclosure are determined by the corresponding silicon carbide fins and nanowires from which they are formed.

In one embodiment of the present application, a semiconductor structure (i.e., dual-channel finFET) is provided that includes at least one silicon carbide fin located on a surface of a substrate. The disclosed structure also includes a graphene nanoribbon located on each bare sidewall of the at least one silicon carbide fin. The disclosed structure further includes a gate structure oriented perpendicular to the at least one silicon carbide fin. The gate structure also overlaps a portion of each graphene nanoribbon and is located atop a portion of the at least one silicon carbide fin. In the disclosed structure, the portion of the each graphene nanoribbon overlapped by the gate structure defines a channel region of the semiconductor structure.

In another embodiment of the present application, a semiconductor structure is provided that includes at least one silicon fin located on a surface of a substrate. The disclosed structure also includes a silicon carbide fin located on each bare sidewall of the at least one silicon fin, and a graphene nanoribbon located on a sidewall of each silicon carbide fin. The disclosed structure further includes a gate structure oriented perpendicular to each silicon carbide fin and the at least one silicon fin. The gate structure also overlaps a portion of each graphene nanoribbon and is located atop a portion of each of the silicon carbide fins and the at least one silicon fin.

The portion of the each graphene nanoribbon overlapped by the gate structure defines a channel region of the semiconductor structure.

In a further embodiment of the present application, a semiconductor structure is provided that includes at least one pair of spaced apart graphene nanoribbons located on a surface of a substrate. This structure also includes a first gate structure located on one sidewall of each spaced apart graphene nanoribbon, wherein the sidewalls of each graphene nanoribbon containing the first gate structure are not facing each other. The structure further includes a planarizing dielectric material located adjacent the first gate structure, and at least a gate conductor of a second gate structure located between the at least one pair of spaced apart graphene nanoribbons. In some embodiments, an upper portion of the gate conductor of the second gate structure can contact an upper surface of the first gate structure.

In an even further embodiment of the present application, a semiconductor structure is provided that includes at least one suspended carbon nanotube located atop a surface of a substrate, and a gate structure oriented perpendicular to the at least one suspended carbon nanotube. The gate structure surrounds a portion of the at least one suspended carbon nanotube, and portions of the at least one carbon nanotube surrounded by the gate structure define a channel region of the semiconductor structure.

The present disclosure also provides a method of forming a semiconductor structure. The method includes providing at least one silicon carbide fin having at least bare sidewalls on a surface of a substrate. A graphene nanoribbon is formed on each bare sidewall of the silicon carbide fin by annealing at a temperature from 1200° C. up to, but not beyond the melting point of the substrate in an ambient such as, but not limited to diluted silane. At least a gate structure is formed adjacent the graphene nanoribbon.

BRIEF DESCRIPTION OF THE DRAWINGS

In the following drawing description, when the term "cross sectional" is used the corresponding drawings will show objects (or materials) that are present in a cross-section plane. When the term "side-view" is used the corresponding drawings will show objects that are directly visible at a right angle and may reside behind the cross-section plane.

DETAILED DESCRIPTION

Figure 1:
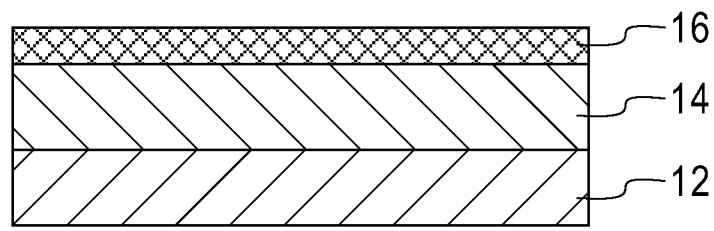
FIG. 1 is a pictorial representation (through a cross sectional view) depicting a silicon carbide-on-insulator substrate that can be employed in one embodiment of the present disclosure.

The present disclosure, which provides semiconductor structures including parallel graphene nanoribbons or carbon nanotubes, which can be used as device channels, oriented along crystallographic directions, and methods of fabricating such structures, will now be described in greater detail by referring to the following discussion and drawings that accompany the present application. It is noted that the drawings of the present application are provided for illustrative purposes only and, as such, the drawings are not drawn to scale. It is also noted that in the drawings like and corresponding elements are referred to using like reference numerals.

In the following description, numerous specific details are set forth, such as particular structures, components, materials, dimensions, processing steps and techniques, in order to provide an understanding of the various embodiments of the present disclosure. However, it will be appreciated by one of ordinary skill in the art that the various embodiments of the present disclosure may be practiced without these specific details. In other instances, well-known structures or processing steps have not been described in detail in order to avoid obscuring the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As mentioned above, the present disclosure provides semiconductor structures including parallel graphene nanoribbons or carbon nanotubes, which can be used as device channels, oriented along crystallographic directions as well as methods of fabricating such semiconductors structures. The methods of the present disclosure, which will be described in further detail herein below, form the graphene nanoribbons or carbon nanotubes from a template of silicon carbide fins or nanowires. The location, orientation and chirality of the graphene nanoribbons and the carbon nanotubes that are provided in the present disclosure are determined by the corresponding silicon carbide fins and nanowires from which they are formed. As such, the methods of the present disclosure can be used in existing semiconductor processing flows and provide a technology in which a dense population of graphene nanoribbons and carbon nanotubes can be selectively placed on a substrate.

Reference is first made to FIGS. 1, 2A-2D, 3, 4A, 4B, 5A, 5B, 6A and 6B which illustrate one embodiment of the present disclosure in which a dual-channel finFET including graphene nanoribbons is provided.

Referring first to FIG. 1, there is illustrated a silicon carbide-on-insulator substrate 10 that can be employed in one embodiment of the present disclosure. The silicon carbide-on-insulator substrate 10 shown in FIG. 1 includes, from bottom to top, a handle substrate 12, a buried insulating layer 14 and a silicon carbide layer 16.

The handle substrate 12 of the silicon carbide-on-insulator substrate 10 may include any semiconducting material or insulating material such as, for example, Si, SiC, GaN, AlN, $Al_2O_3$, $Si_3N_4$ or other like compound semiconductors or metal oxides. The materials used for handle substrate 12 typically have a melting point higher than 1200° C. Multilayers of these semiconductor materials can also be used as the semiconductor material of the handle substrate 12. In one embodiment, the handle substrate 12 is comprised of silicon. In another embodiment, the handle substrate 12 is comprised of silicon carbide.

The handle substrate 12 and the silicon carbide layer 16 of the silicon carbide-on-insulator substrate 10 may have the same or different crystal orientation. For example, the surface crystal orientation of the handle substrate 12 and the silicon carbide layer 16 may be {100}, {110}, or {111}. Other crystallographic orientations besides those specifically mentioned can also be used in the present disclosure. The handle substrate 12 of the silicon carbide-on-insulator substrate 10 may be a single crystalline semiconductor material, a polycrystalline material, or an amorphous material. Typically, the silicon carbide layer 16 of the silicon carbide-on-insulator substrate 10 is a single crystalline semiconductor material.

In one embodiment of the present disclosure, the handle substrate 12 and/or the silicon carbide layer 16 of the silicon carbide-on-insulator substrate 10 may be undoped. In another embodiment of the present disclosure, the handle substrate 12 and/or the silicon carbide layer 16 of the silicon carbide-on-insulator substrate 10 are doped. When the handle substrate 12 and/or the silicon carbide layer 16 of the silicon carbide-on-insulator substrate 10 are doped, the dopant may be a p-type or an n-type dopant.

The buried insulating layer 14 of the silicon carbide-on-insulator substrate 10 may be an oxide, nitride, oxynitride or any multilayered combination thereof. In one embodiment, the buried insulating layer 14 of the silicon carbide-on-insulator substrate 10 is an oxide such as, for example, silicon oxide, aluminum oxide, and silicon nitride. The buried insulating layer 14 may be continuous or it may be discontinuous. When a discontinuous buried insulating layer 14 is present, the buried insulating layer 14 exists as an isolated island that is surrounded by semiconductor material.

The thickness of the silicon carbide layer 16 of the silicon carbide-on-insulator substrate 10 is typically from 0.5 nm to 10 nm, with a thickness from 1 nm to 5 nm being more typical. If the thickness of the silicon carbide layer 16 exceeds the above mentioned ranges, a thinning step such as, for example, oxidation followed by an oxide stripping, planarization or etching can be used to reduce the thickness of the silicon carbide layer 16 to a value within one of the ranges mentioned above.

The buried insulating layer 14 of the silicon carbide-on-insulator substrate 10 typically has a thickness from 1 nm to 200 nm, with a thickness from 100 nm to 150 nm being more typical. In embodiments in which the handle substrate 12 is an insulator (such as $Al_2O_3$) there is no need for insulating layer 14. In this case, the substrate 10 may comprise just the silicon carbide layer 16 over the handle substrate 12. However, in some cases layer 14 is used even when the handle substrate 12 is an insulator. For example when substrate 10 is fabricated by bonding, it is sometimes hard to bond silicon carbide directly to substrate 12 and an intermediate insulating layer can be used as the "glue" between the silicon carbide and the handle substrate. The thickness of the handle substrate 12 of the silicon carbide-on-insulator substrate 10 is inconsequential to the present disclosure.

In one embodiment, the silicon carbide-on-insulator substrate 10 may be formed utilizing a process in which carbon ions are implanted into a SIMOX (Separation by IMplanted OXygen) wafer. In another embodiment of the present disclosure, the silicon carbide-on-insulator substrate 10 is formed by first providing a handle substrate 12. Next, the buried insulating layer 14 is formed on the handle substrate 12 and thereafter the silicon carbide layer 16 is formed on the buried insulating layer 14. To obtain a single-crystal SiC layer 16, formation of layers 12 and 14 can be done by epitaxy. In yet a further embodiment of the present disclosure, the silicon carbide-on-insulator substrate 10 is formed by layer transfer. When a layer transfer process is employed, an optional thinning step may follow the bonding of a wafer including a handle substrate to a wafer including a silicon carbide substrate. The optional thinning step reduces the thickness of the silicon carbide substrate to a layer having a thickness that is more desirable and within the ranges provided above.

Figure 2A:
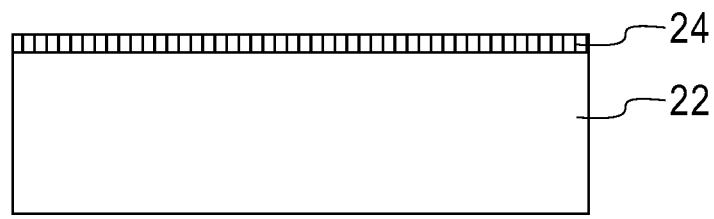
FIGS. 2A-2D are pictorial representation (through cross sectional views) depicting one possible method that can be used in forming the silicon carbide-on-insulator substrate shown in FIG. 1.

Reference is now made to FIGS. 2A-2D which illustrate the basic processing steps of a layer transfer process that that can be used in one embodiment of the present disclosure in forming the silicon carbide-on-insulator substrate 10 shown in FIG. 1. Referring first to FIG. 2A, there is illustrated an initial structure 20 that can be used in forming the silicon carbide-on-insulator substrate 10 shown in FIG. 1. The initial structure 20 includes a silicon carbide substrate 22 having a first insulating layer 24 located on an upper surface thereof. The first insulating layer 24 includes one of the insulating materials mentioned above for buried insulating layer 14. In one embodiment, the first insulating layer 24 can be formed by a thermal technique including oxidation and/or nitridation. Alternatively, the first insulating layer 24 can be formed on an upper surface of the silicon carbide substrate 22 by a deposition process including, for chemical vapor deposition, plasma enhanced chemical vapor deposition, atomic layer deposition, and chemical solution deposition.

Figure 2B:
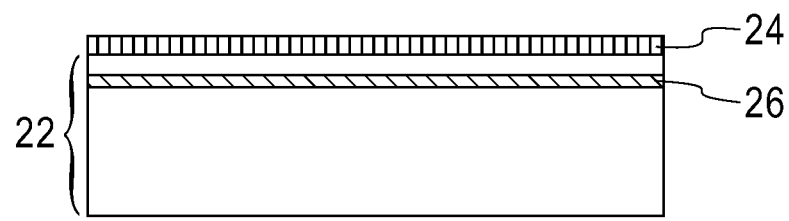

Referring now to FIG. 2B, there is illustrated the structure of FIG. 2A after forming a hydrogen implant region 26 within the silicon carbide substrate 22. The hydrogen implant region 26 is formed utilizing any conventional hydrogen ion implantation process. The hydrogen implant region 26 includes a sufficient concentration of hydrogen ions that upon subjecting the same to a subsequent annealing blistering occurs within the implant region 26 which removes a portion of the silicon carbide substrate 22 from the structure.

Figure 2C:
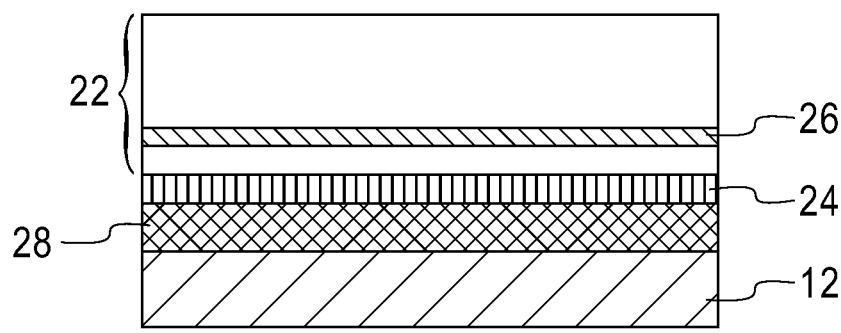
Figure 2D:
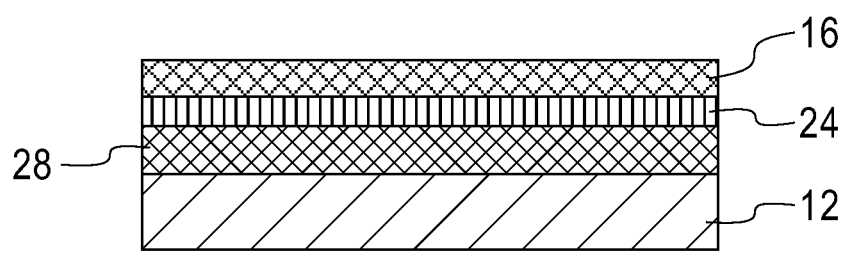

Referring now to FIG. 2C, there is illustrated the structure of FIG. 2B after providing a handle substrate 12 having a second insulating layer 28 located on an upper surface thereof, flipping the structure shown in FIG. 2B and bonding the two wafers together by bringing the same in intimate contact with each other; in the embodiment illustrated the first and second insulator layers 24, 28 are brought into intimate contact with each other. Bonding is typically initiated by van der Waals forces between the two flat surfaces 24 and 28.

Applying pressure on the two wafers can also be used to initiate bonding. Annealing is used to strengthen the bond between the two wafers. After annealing the bond between the two surfaces is a covalent bond. Typical annealing temperatures are from 300° C. to 1200° C., while the annealing duration is from 0.5 hours to 24 hours. As mentioned above, annealing also leads to separation of a part of the silicon carbide substrate 22 due to hydrogen blistering that occurs in the hydrogen implant region 26. The remaining silicon carbide which is not removed from the original silicon carbide substrate 22 is then polished to obtain a silicon carbide layer 16 whose surface has root mean square (RMS) roughness from 0.1 nm to 0.3 nm. The resultant structure after polishing is shown, for example, in FIG. 2D. During bonding, the first and second insulating layers 24, 28 can merge and form the buried insulating layer 14 of the silicon carbide-on-insulator substrate 10.

Figure 3:
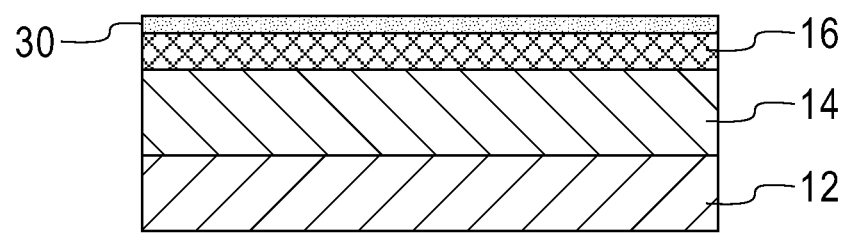
FIG. 3 is a pictorial representation (through a cross sectional view) depicting the structure of FIG. 1 after forming a hard mask on an upper surface of the silicon carbide layer of the silicon carbide-on-insulator substrate.

Notwithstanding which process is employed in forming the silicon carbide-on-insulator substrate 10 shown in FIG. 1, a hard mask 30 is formed on an upper surface of the silicon carbide layer 16 of the silicon carbide-on-insulator substrate 10 providing the structure such as shown, for example, in FIG. 3. The hard mask 30 employed in the present disclosure includes an oxide, nitride, oxynitride or any multilayered combination thereof. In one embodiment, the hard mask 30 is a semiconductor oxide such as, for example, silicon oxide. In another embodiment, the hard mask 30 is a semiconductor nitride such as, for example, silicon nitride. In yet a further embodiment of the present disclosure, the hard mask 30 includes a multilayered stack of a semiconductor oxide and a semiconductor nitride, i.e., a silicon oxide-silicon nitride multilayered stack.

In one embodiment, a thermal technique such as, for example, oxidation and/or nitridation can be used in forming the hard mask 30 on the upper surface of the silicon carbide layer 16. In another embodiment, a deposition process such as, for example, chemical vapor deposition, plasma enhanced chemical vapor deposition, atomic layer deposition and chemical solution deposition can be used in forming the hard mask 30.

The thickness of the hard mask 30 may vary depending on the type of hard mask material employed and the technique used in forming the same. Typically, the hard mask 30 has a thickness from 5 nm to 50 nm, with a thickness from 10 nm to 20 nm being more typical.

Figure 4A:
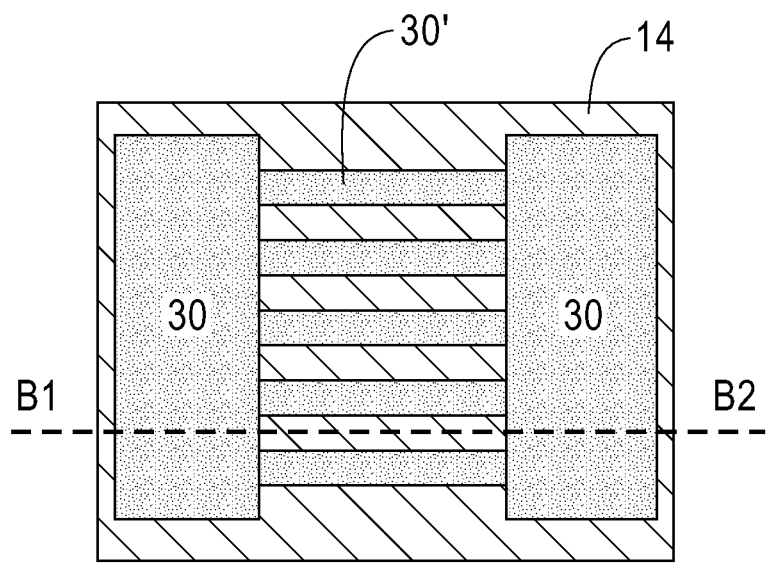
FIG. 4A is a pictorial representation (through a top down view) depicting the structure of FIG. 3 after forming a plurality of silicon carbide fins that include a patterned hard mask thereon in at least one region of the substrate.
Figure 4B:
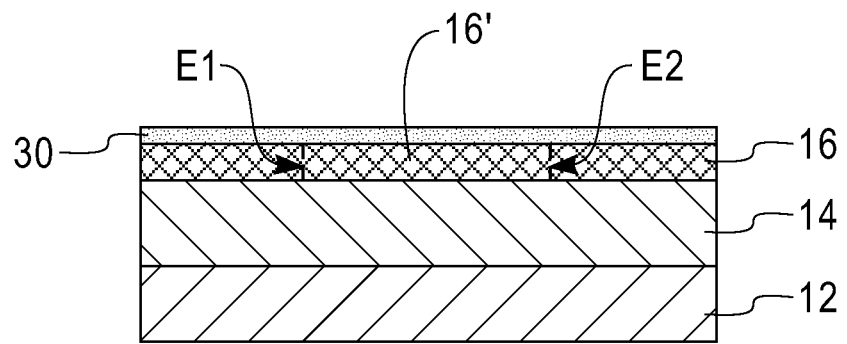
FIG. 4B is a pictorial representation through a side-view after the structure of FIG. 4A was cut at the plane marked by B1-B2.

Referring now to FIGS. 4A-4B, there is illustrated the structure shown in FIG. 3 after forming a plurality of silicon carbide fins 16' on the surface of the buried insulating layer 14 of the silicon carbide-on-insulator substrate 10. As shown, each silicon carbide fin includes a patterned hard mask 30' thereon. The term "fin" is used throughout the present disclosure to denote a portion of either silicon carbide or silicon that was etched out of a silicon carbide layer or a silicon layer. The fin has a rectangular cross-section, with the fin height being defined by the thickness of silicon carbide layer 16 and the fin width being defined by the width of the patterned hard mask 30'.

It is noted that although the drawings and following description refer to a plurality of silicon carbide fins, the present application also can be employed when a single silicon carbide fin is formed. It is also noted that in the top down views, the silicon carbide fins 16' are located beneath the patterned hard mask 30'.

The plurality, i.e., array, of silicon carbide fins 16' is located in at least one region of the silicon carbide-on-insulator substrate 10. Each silicon carbide fin 16' has a bottom surface that is direct contact with an upper surface of the buried insulating layer 14 of the silicon carbide-on-insulator substrate 10, a top surface in direct contact with a bottom surface of the patterned hard mask 30' and bare sidewalls. As is illustrated, each silicon carbide fin 16' has a first end portion E1 that is in contact with a first unpatterned portion of the silicon carbide layer 16, and a second end portion E2 that is in contact with a second unpatterned portion of the silicon carbide layer 16. As also illustrated, the plurality of silicon carbide fins 16' are arranged parallel to each other and a uniform space is present between each neighboring silicon carbide fin 16'. The array of silicon carbide fins 16' can thus be considered as a ladder arrangement in which each silicon carbide fin represents a rung of the ladder.

The structure shown in FIGS. 4A-4B can be formed by lithography and etching. Specifically, the structure shown in FIGS. 4A-4B can be formed by first applying a photoresist material (not shown) to the upper surface of the hard mask 30. The photoresist material, which can be a positive-tone material, a negative-tone material or a combination of both positive-tone and negative-tone materials, can be formed utilizing any conventional deposition process including, for example, spin-on coating. Following the application of the photoresist material, the photoresist material is subjected to a desired pattern of radiation (for example, optical illumination through a mask, or electron beam lithography) and thereafter the resist material is developed utilizing any conventional resist developer.

With the patterned resist on the surface of the hard mask 30, the unprotected portions of the hard mask 30 and underlying portions of the silicon carbide layer 16 not covered by the patterned resist are removed utilizing one or more etching processes. The one or more etching processes that can be used in removing the unprotected portions of the hard mask 30 and underlying portions of the silicon carbide layer 16 not covered by the patterned resist include dry etching, wet etching or any combination thereof. When dry etching is employed, one of reactive ion etching (RIE), ion beam etching, and plasma etching can be used. When wet etching is employed, a chemical etchant that is selective in remove unprotected portions of at least the hard mask 30 can be used. In one embodiment of the present application, RIE can be used to remove the unprotected portions of the hard mask 30 and the underlying portions of the silicon carbide layer 16.

In some embodiments, the patterned resist remains atop the structure during the entire patterning process. In other embodiments of the present disclosure, the patterned resist is removed from the structure after the pattern has been transferred into the hard mask 30. Notwithstanding when the patterned resist is removed, the patterned resist is removed utilizing a conventional resist removal processing such as ashing.

Figure 5A:
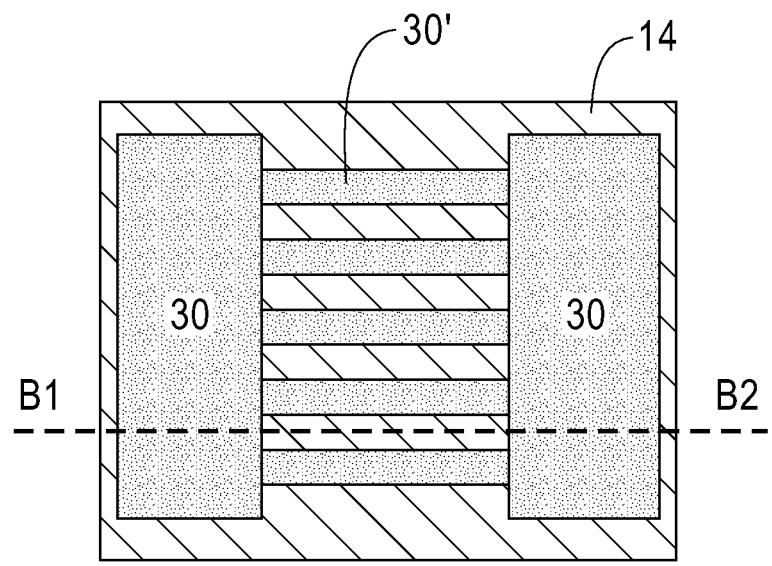
FIG. 5A is a pictorial representation (through a top down view) depicting the structure of FIG. 4A after forming graphene nanoribbons on bare sidewalls of each of the silicon carbide fins.
Figure 5B:
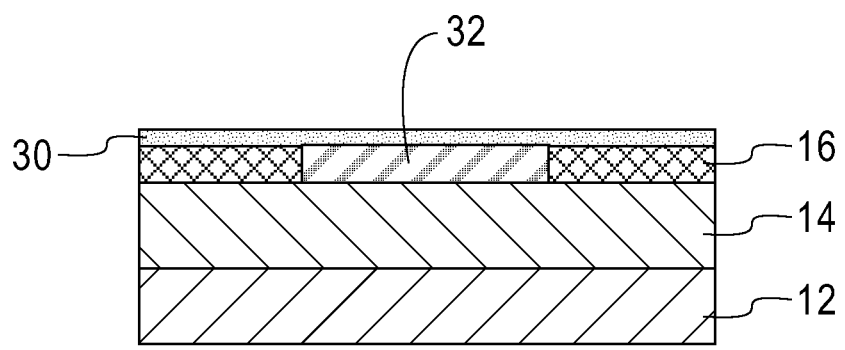
FIG. 5B is a pictorial side-view representation through cut B1-B2 shown in the top down view of FIG. 5A.

Referring now to FIGS. 5A-5B, there is illustrated the structure of FIGS. 4A-4B after forming graphene nanoribbons 32 on the bare sidewalls of each of the silicon carbide fins 16'. The term "nanoribbon" is used throughout the present application to denote a rectangular graphene sheet with one dimension being a few nanometers wide. It is noted that in the top down view the nanoribbons are located on the sidewalls of the fins and are thus not visible.

Although not illustrated in the drawings, the present application includes an embodiment in which at least each patterned hard mask 30' is removed from atop the silicon carbide fins 16' prior to forming the graphene nanoribbons. When the patterned hard masks 30' are removed, a graphene nanoribbon can be formed on the bare sidewalls as well as the now bare upper surface of each silicon carbide fin. It is noted that in this case and for some applications, one may want to choose the fin orientation such that the exposed SiC fin sidewalls and the exposed top surface have the same crystal orientation (for example, all having a (100) surface).

The term "graphene" as used throughout the present application denotes a one-atom-thick planar sheet of $sp^2$-bonded carbon atoms that are densely packed in a honeycomb crystal lattice. The graphene employed as graphene nanoribbons 32 has a two-dimensional (2D) hexagonal crystallographic bonding structure. The graphene that can be employed as graphene nanoribbon 32 can be comprised of single-layer graphene (nominally 0.34 nm thick), few-layer graphene (2-10 graphene layers), multi-layer graphene (>10 graphene layers), a mixture of single-layer, few-layer, and multi-layer graphene, or any combination of graphene layers mixed with amorphous and/or disordered carbon phases. The graphene employed as graphene nanoribbons 32 can also include, if desired, substitutional, interstitial and/or intercalated dopant species as well.

Each graphene nanoribbon 32 that is formed on the bare sidewalls of each silicon carbide fin 16' can be formed by first cleaning the bare sidewalls of each silicon carbide fin 16 by performing a first anneal in a dilute silane-containing ambient. The first anneal that can be used to clean the bare sidewalls of each silicon carbide fin 16' is typically performed at a temperature from 800° C. to 900° C., with a first anneal temperature from 810° C. to 825° C. being more typical.

As mentioned above, the first anneal is performed in a dilute silane-containing ambient. By "silane-containing ambient" it is meant any atmosphere that includes at least one compound of hydrogen and silicon that has the general formula $Si_nH_{2n+2}$ wherein n is any integer, particularly n is from 1 to 4. Examples of silanes that can be employed within the silane-containing ambient include, but are not limited to, silane and disilane.

The silane-containing ambient is typically diluted with an inert gas including for example, at least one of He, Ne, Ar, Kr and Xe. In one embodiment, the content of silane within the dilute silane-containing ambient is typically from 1% to 100% based on the total amount of the dilute silane-containing ambient. In another embodiment, the content of silane within the dilute silane-containing ambient is typically from 15% to 25% based on the total amount of the dilute silane-containing ambient.

After performing the first anneal, a second anneal is performed that grows graphene nanoribbons 32 on the bare sidewalls of each silicon carbide fin 16'. For each silicon carbide fin 16', two graphene nanoribbons are formed on opposing sidewall surfaces of the fin. Portions of each graphene nanoribbon will serve as the channel for the device. The second anneal is typically performed at a temperature from about 1200° C. up to, but not exceeding the melting temperature of the handle wafer 12, with a second anneal temperature from 1300° C. to 2000° C. being more typical. During the second anneal, silicon is release from the bare sidewalls of the silicon carbide fins 16' forming graphene nanoribbons thereon. The width of each graphene nanoribbon 32 that is formed is defined by the height of each silicon carbide fin 16'. Typically, the width of each graphene nanoribbon 32 is within a range from 0.5 nm to 10 nm.

Figure 6A:
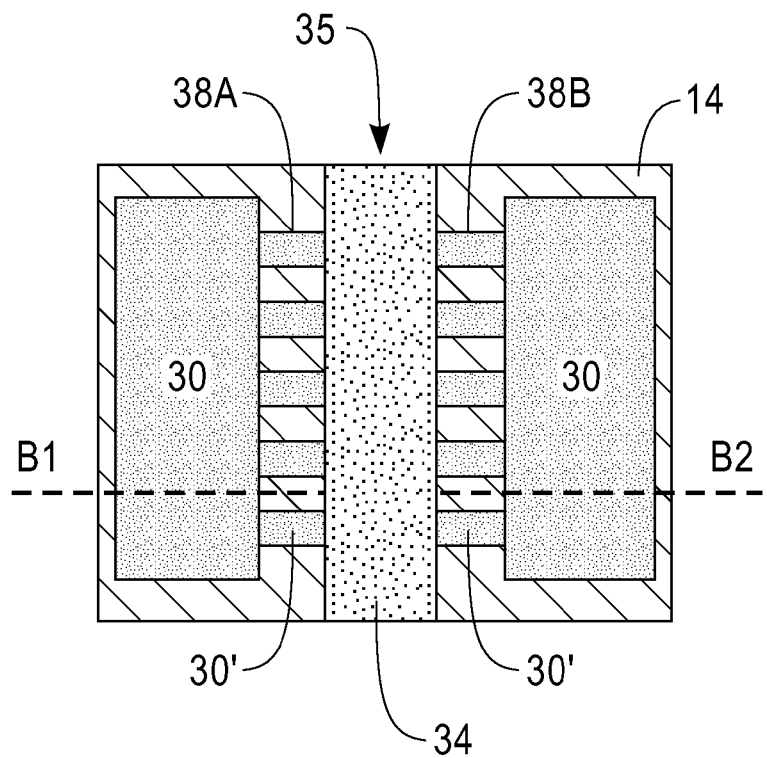
FIG. 6A is a pictorial representation (through a top down view) depicting the structure of FIG. 5A after forming a gate structure including a gate dielectric and a gate conductor on a portion of each silicon carbide fin which includes graphene nanoribbons on the sidewalls thereof.
Figure 6B:
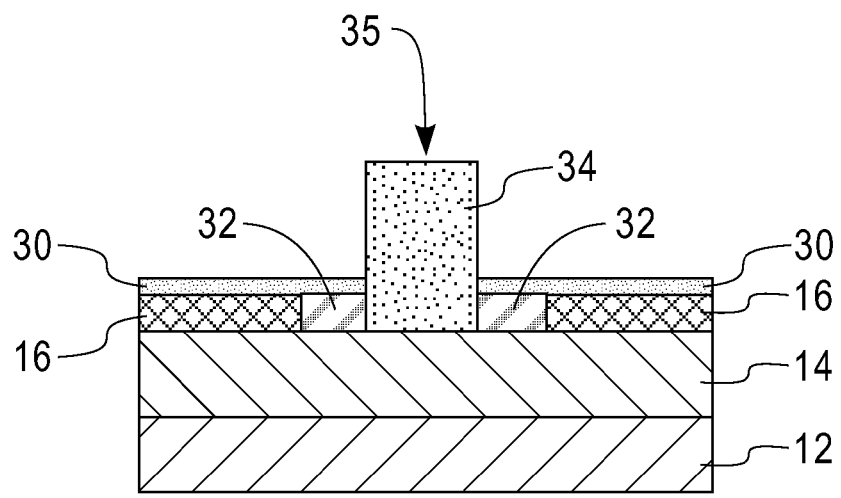
FIG. 6B is a pictorial side-view representation through cut B1-B2 shown in the top down view of FIG. 6A.

Referring now to FIGS. 6A-6B, there is illustrated the structure of FIGS. 5A-5B after forming a gate structure 35 including a gate dielectric (not shown) and a gate conductor 34 on a portion of each silicon carbide fin 16' which includes graphene nanoribbons 32 on the sidewalls thereof. The gate dielectric, which is not shown, is located beneath the gate conductor 34 and atop the buried insulating layer 14. Further, the gate dielectric completely surrounds each silicon carbide fin 16' that includes a graphene nanoribbon 32 on its sidewalls.

In one embodiment of the present disclosure, the gate dielectric that can be used in this embodiment can include a metal oxide or a semiconductor oxide. Exemplary gate dielectrics that may be use include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Multilayered stacks of these dielectric materials can also be employed as the gate dielectric layer. Each value of x is independently from 0.5 to 3 and each value of y is independently from 0 to 2.

The thickness of the gate dielectric that can be employed may vary depending on the technique used to form the same. Typically, the gate dielectric that can be employed has a thickness from 1 nm to 20 nm, with a thickness from 2 nm to 10 nm being more typical.

The gate dielectric can be formed by methods well known in the art. In one embodiment, the gate dielectric can be formed by a deposition process such as, for example, chemical vapor deposition (CVD), plasma enhanced chemical vapor deposition (PECVD), physical vapor deposition (PVD), molecular beam deposition (MBD), pulsed laser deposition (PLD), liquid source misted chemical deposition (LSMCD), and atomic layer deposition (ALD). If the gate dielectric is a stack of several layers, some of the layers can be deposited by chemical deposition or a spin-on technique.

After forming the gate dielectric, the gate conductor, i.e., gate line, 34 can be formed. The gate conductor 34 includes any conductive material including, but not limited to, polycrystalline silicon, polycrystalline silicon germanium, an elemental metal (e.g., tungsten, titanium, tantalum, aluminum, nickel, ruthenium, palladium and platinum), an alloy of at least two metals, a metal nitride (e.g., tungsten nitride, aluminum nitride, and titanium nitride), a metal silicide (e.g., tungsten silicide, nickel silicide, and titanium silicide) and multilayered combinations thereof. In one embodiment, the conductive material that can be employed as the gate conductor 34 can be comprised of an nFET metal gate. In another embodiment, the conductive material that can be employed as gate conductor 34 can be comprised of a pFET metal gate. The nFET and pFET gate conductors are chosen based on the desired FET threshold voltage (Vt). In a further embodiment, the conductive material that can be employed as gate conductor 34 can be comprised of polycrystalline silicon. The polysilicon conductive material can be used alone, or in conjunction with another conductive material such as, for example, a metal conductive material and/or a metal silicide material.

The conductive material that is employed as the gate conductor 34 can be formed utilizing a conventional deposition process including, for example, chemical vapor deposition (CVD), plasma enhanced chemical vapor deposition (PECVD), physical vapor deposition (PVD), sputtering, atomic layer deposition (ALD) and other like deposition processes. When Si-containing materials are used as the conductive material, the Si-containing materials can be doped within an appropriate impurity by utilizing either an in-situ doping deposition process or by utilizing deposition, followed by a step such as ion implantation or gas phase doping in which the appropriate impurity is introduced into the Si-containing material. When a metal silicide is formed, a conventional silicidation process is employed. The as-deposited conductive material typically has a thickness from 1 nm to 100 nm, with a thickness from 3 nm to 30 nm being even more typical. Following deposition of the conductive material, the conductive material is patterned by lithography and etching into gate conductor, i.e., gate line, 34. During the patterning of the conductive material, the gate dielectric may also be patterned as well.

Specifically, FIGS. 6A-6B illustrate a dual-channel finFET that includes at least one silicon carbide fin 16' located on a surface of a substrate, i.e., the buried insulating layer 14 of the initial silicon carbide-on-insulator substrate 10. The disclosed structure also includes a graphene nanoribbon 32 located on each bare sidewall of the at least one silicon carbide fin 16'. The disclosed structure further includes a gate structure 35 oriented perpendicular to the at least one silicon carbide fin 16'. The gate structure 35 also overlaps a portion of each graphene nanoribbon 32 and is located atop a portion of the at least one silicon carbide fin 16'. In the disclosed structure, the portion of the each graphene nanoribbon 32 overlapped by the gate structure 35 defines a channel region of the semiconductor structure.

The structure shown in FIGS. 6A-6B also includes a source region 38A and a drain region 38B. The source region 38A is located at one portion of each graphene nanoribbon which is not overlapped by the gate structure 35, while the drain region 38B is located at another portion of each graphene nanoribbon which is not overlapped by the gate structure 35. The source region 38A and drain region 38B are connected by the channel region.

In one embodiment, the source region 38A and the drain region 38B can be formed by chemical doping (n-type or p-type) of portions of the graphene nanoribbon 32 that are not overlapped by the gate structure 35. For example, graphene can be doped to be p-type by exposure to nitric acid. In another embodiment, the source region 38A and the drain region 38B are composed of a metal carbide which is formed by first forming a metal layer such as Ti, W, Ni, Ta, Co or alloys thereof, on a portion of each graphene nanoribbon in which the source/drain regions 38A, 38B are to be formed. The metal layer and the graphene nanoribbon are then reacted by annealing. For example, to form tungsten carbide (WC) at a temperature of about 900° C. or greater is needed. Following the anneal, any unreacted metal layer can be removed utilizing a selective etching process. Chemical vapor deposition with a metal precursor can also be applied to form carbides.

Figure 7A:
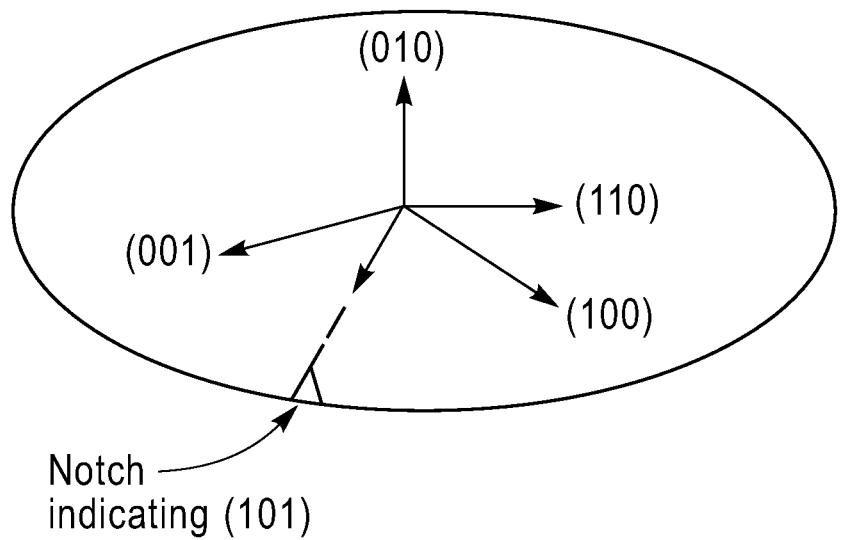
FIGS. 7A-7B are pictorial representations illustrating that the type of graphene that can be formed on the sidewalls of the silicon carbide fins provided in FIGS. 6A-6B is dependent on the surface orientation of the silicon carbide fin.
Figure 7B:
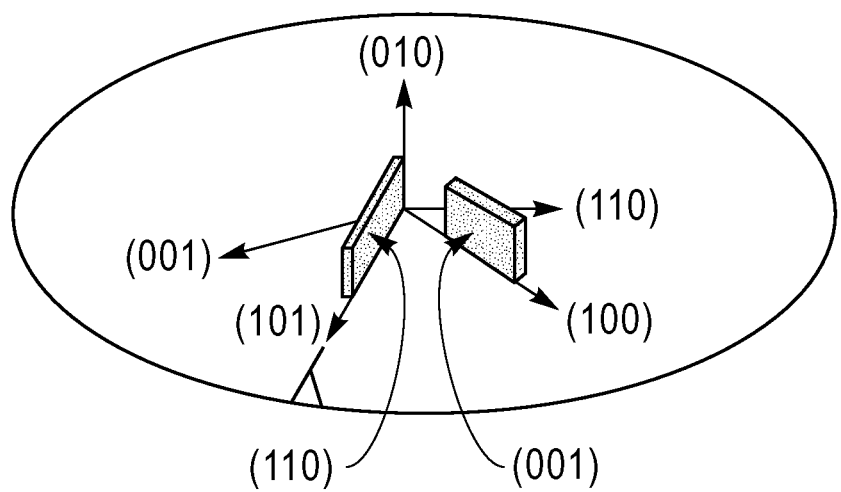

It should be noted that the type of graphene that can be formed on the sidewalls of the silicon carbide fins in the present disclosure is dependent on the surface orientation of the silicon carbide fin. This is shown in FIGS. 7A-7B. Specifically, FIG. 7A is a drawing which shows some of the possible crystal planes of a silicon carbide-on insulator substrate with a notch in the (101) direction. As shown in FIG. 7B, by choice of the wafer surface orientation and the layout of the fin with respect to the notch it is possible to obtain a fin with all surface being <100> or a fin with sidewalls being (110).

Referring now to FIGS. 8-18A and 18B, there is illustrated another embodiment of the present disclosure in which graphene nanoribbons are formed on sidewalls of a silicon fin. Specifically, FIGS. 8-18A and 18B provide a method of fabricating dual-channel finFETs, which can be optionally double gated.

Figure 8:
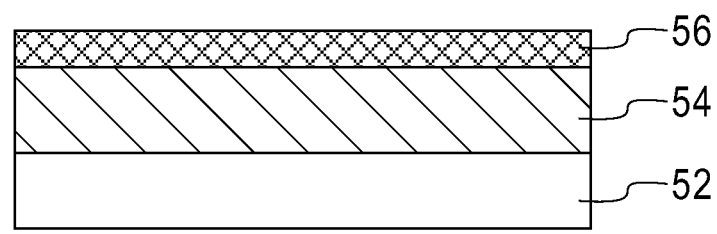
FIG. 8 is a pictorial representation (through a cross sectional view) illustrating a silicon-on-insulator substrate including, from bottom to top, a handle substrate, a buried insulator layer and a silicon layer that can be employed in another embodiment of the present disclosure.

Referring first to FIG. 8, there is illustrated a silicon-on-insulator substrate 50 that can be employed in this embodiment of the present disclosure. The silicon-on-insulator substrate 50 includes, from bottom to top, a handle substrate 52, a buried insulating layer 54 and a silicon layer 56. It is observed that the silicon-on insulator substrate 50 shown in FIG. 8 is similar to the silicon carbide-on-insulator substrate 10 shown in FIG. 1 except that a silicon layer 56 is used in place of the silicon carbide layer 16. As such, the materials and thicknesses for the handle substrate 52 and the buried insulating layer 54 used in this embodiment of the present disclosure are the same as those mentioned above for handle substrate 12 and buried insulating layer 14 of the silicon carbide-on-insulator substrate 10. It is also noted that the general description of doping, crystal orientation, and thickness given above for the silicon carbide layer 16 are applicable here for the silicon layer 56.

Also, the silicon-on-insulator (SOI) substrate 50 can be made using one of the techniques mentioned above in forming the silicon carbide-on insulator-substrate 10 with the except that silicon is used in place of silicon carbide. Furthermore the making of SOI wafers is a mature technology and SOI wafers are available commercially.

Figure 9:
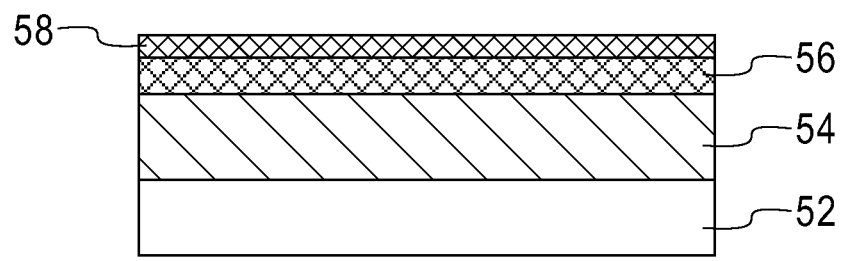
FIG. 9 is a pictorial representation (through a cross sectional view) illustrating the silicon-on-insulator substrate of FIG. 8 after forming a hard mask on an upper surface of the silicon layer of the silicon-on-insulator substrate.

Referring now to FIG. 9, there is depicted the silicon-on-insulator substrate 50 of FIG. 8 after forming a hard mask 58 on an upper surface of the silicon layer 56. The hard mask 58 that is employed in this embodiment of the present disclosure can include one of the hard mask materials mentioned above for hard mask 30. Also, hard mask 58 that employed in this embodiment of the present disclosure may be made using one of the techniques mentioned above for forming hard mask 30 and the thickness of hard mask 58 may fall within the range provided above for hard mask 30.

Figure 10:
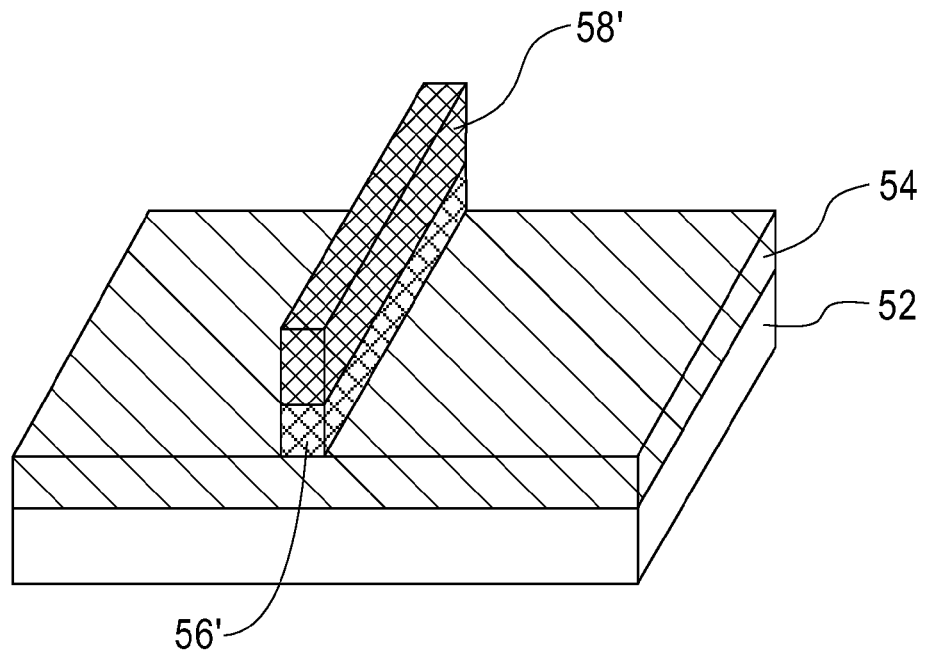
FIG. 10 is a three dimensional representation of the structure shown in FIG. 9 after forming at least one silicon fin on an upper surface of the buried insulator layer, each silicon fin having a patterned hard mask located thereon.

Referring now to FIG. 10, there is illustrated the structure shown in FIG. 9 after forming at least one silicon fin 56' on an upper surface of the buried insulator layer 54. Although a single silicon fin 56' is illustrated in FIG. 10, a plurality of silicon fins 56' can be formed on the surface of the buried insulating layer 54 similar to the plurality of silicon carbide fins 16' formed in the previous embodiment of the present disclosure. As is shown, each silicon fin 56' includes a patterned hard mask 58' located on an upper surface of the silicon fin 56'. Also, each silicon fin 56' has bare sidewalls.

The silicon fin 56' can be formed by lithography and etching. Specifically, the structure shown in FIG. 10 can be formed by first applying a photoresist material (not shown) to the upper surface of hard mask 58. The photoresist material, which can be a positive-tone material, a negative-tone material or a combination of both positive-tone and negative-tone materials, can be formed utilizing any conventional deposition including, for example, spin-on coating. Following the application of the photoresist material, the photoresist material is subjected to a desired pattern of radiation and thereafter the resist material is developed utilizing any conventional resist developer. With the patterned resist on the surface of the hard mask 58, the unprotected portions of the hard mask 58 and the underlying portions of the silicon layer 56 are then removed utilizing one or more etching process. The one or more etching processes can include dry etching, wet etching or any combination thereof. When dry etching is employed, one of reactive ion etching, ion beam etching, and plasma etching can be used. When wet etching is employed, a chemical etchant that is selective in remove unprotected portions of at least the hard mask 58 can be used. In one embodiment, RIE can be used to remove the unprotected portions of the hard mask 58 and the underlying portions of the silicon layer 56.

In some embodiments, the patterned resist remains atop the structure during the entire patterning process. In other embodiments of the present disclosure, the patterned resist is removed from the structure after the pattern has been transferred into the hard mask 58. Notwithstanding when the patterned resist is removed, the patterned resist is removed utilizing a conventional resist removal processing such as ashing.

Figure 11:
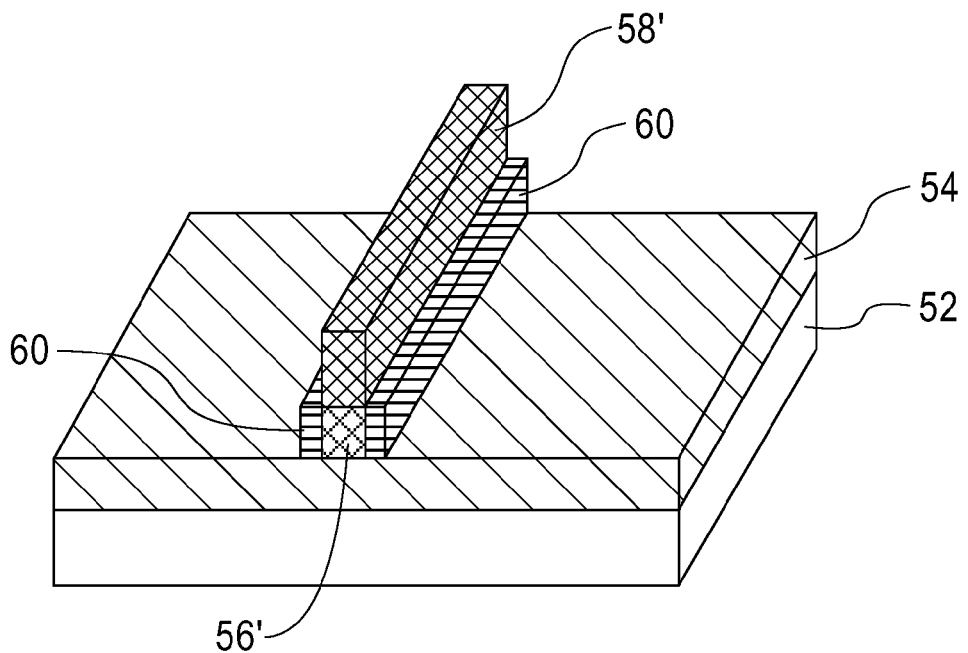
FIG. 11 is a three dimensional representation of the structure shown in FIG. 10 after forming silicon carbide fins on the bare sidewalls of the silicon fin.

Referring now to FIG. 11, there is illustrated the structure shown in FIG. 10 after forming silicon carbide fins 60 on the bare sidewalls of each silicon fin 56'. Although not shown, the patterned mask 58' can be removed from atop each silicon fin 56' prior to forming the silicon carbide fin. In such an instant, a silicon carbide fin can be formed atop the silicon fin 56'.

The silicon fin 56' and hard mask 58' may be removed selectively with respect to the silicon carbide fins 60. The removal of the silicon fin 60 produces a structure which is similar to the structure shown in FIG. 4A where the SiC fins 16' are formed by patterning a SiC-on-insulator layer. There are some differences between the two structures: The first difference is that the number of SiC fins 60 is double that of FIG. 4A, since each silicon fin 56' yields two SiC fins 60. The second difference is that the SiC fins 60 do not have a hardmask cap. One advantage of the method for producing the SiC fins 60 is that the fin thickness is defined by epitaxy as will be explained below. Epitaxy typically allows more uniform control overt the fin thickness than achieved with lithography and patterning of a SiC layer. The rest of the steps discussed in reference to FIGS. 5-6 can be applied to the structure to complete the device fabrication. The remaining of the discussion related to FIGS. 11-18 will be with respect to the embodiment where the silicon fin 56' and hard mask 58' are kept (although they are eventually removed to form a double gate structure).

The silicon carbide fins 60 that are formed on the bare sidewalls of each silicon fin 56' can be formed utilizing a selective epitaxial growth process. Since a selective epitaxial growth process is employed, the silicon carbide fins 60 have the same crystal orientation as that of the sidewall of the silicon fin 56' from which they are grown. The selective epitaxial growth process is typically performed at a temperature from 1200° C. to 1400° C., with a growth temperature from 1325° C. to 1375° C. being more typical. In one embodiment, the selective epitaxial growth process used in forming the silicon carbide fins 60 on the sidewalls of the silicon fin 56' includes at least one precursor that includes both silicon and carbon. In another embodiment, the selective epitaxial growth process used in forming the silicon carbide fins 60 on the sidewalls of the silicon fin 58' includes a first precursor that includes silicon and a second precursor that includes carbon. In any of the aforementioned embodiments, the precursor(s) can be used alone, or admixed with an inert gas.

The silicon carbide fins 60 that are formed on the bare sidewalls of the silicon fin 56' have a thickness extending laterally outward from the sidewall of the silicon fin 56' from 1 nm to 10 nm, with a thickness from 1 nm to 5 nm being more typical. The height of the silicon carbide fins 60 is dependent on the height of the silicon fin 56' that was previously formed.

Figure 12:
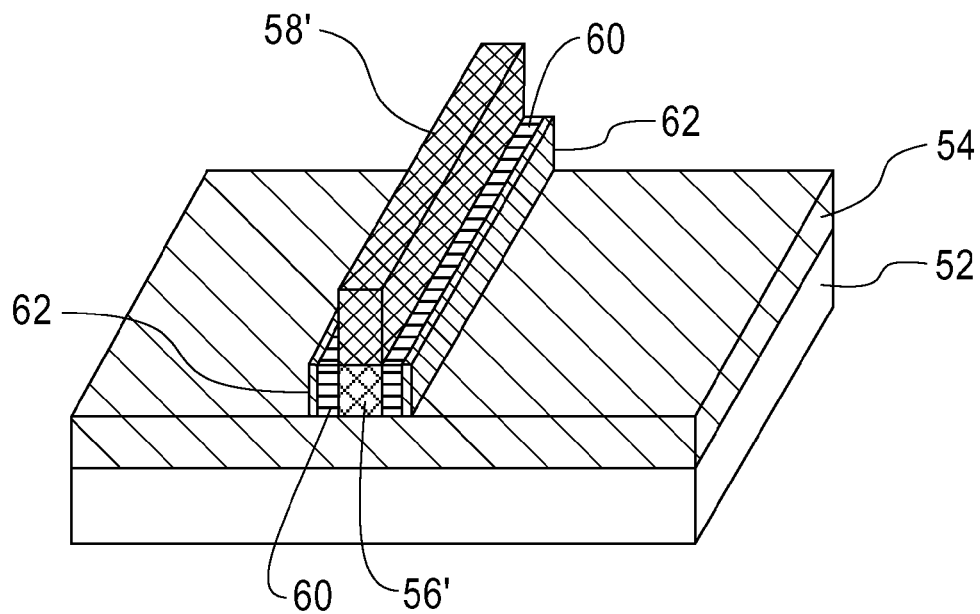
FIG. 12 is a three dimensional representation of the structure shown in FIG. 11 after forming a graphene nanoribbon on bare sidewalls of each silicon carbide fin.

Reference is now made to FIG. 12 which illustrates the structure of FIG. 11 after forming a layer of graphene on bare sidewalls of each silicon carbide fin 60. The layer of graphene can be referred to herein as graphene nanoribbon 62.

The graphene nanoribbons 62 of this embodiment of the present disclosure are formed utilizing the same technique that was employed in forming the graphene nanoribbons 32 in the previous embodiment of the present disclosure. That is, the graphene nanoribbons 62 of this embodiment of the present application can be formed on the bare sidewalls of each silicon carbide fin 60 by first cleaning the bare sidewalls of each silicon carbide fin 60 by performing a first anneal in a dilute silane-containing ambient. The first anneal temperature and silane-containing ambient used in forming graphene nanoribbons 32 can be used here for forming graphene nanoribbons 62.

After performing the first anneal, a second anneal is performed that grows graphene nanoribbons 62 on the bare sidewalls of each silicon carbide fin 60. The second anneal temperature is within the range mentioned above for forming graphene nanoribbons 32, but is kept lower than 1414° C. which is the melting temperature for silicon. During the second anneal, silicon is release from the bare sidewalls of the silicon carbide fins 60 forming graphene nanoribbons 62 thereon. Each graphene nanoribbon 62 that is formed has a thickness extending laterally outward from the surface of silicon carbide fin 60 from one monolayer to six monolayers, with one or two monolayers being more typical. The height of each graphene nanoribbon 62 is determined by the height of both the silicon carbide fins 60.

Figure 13:
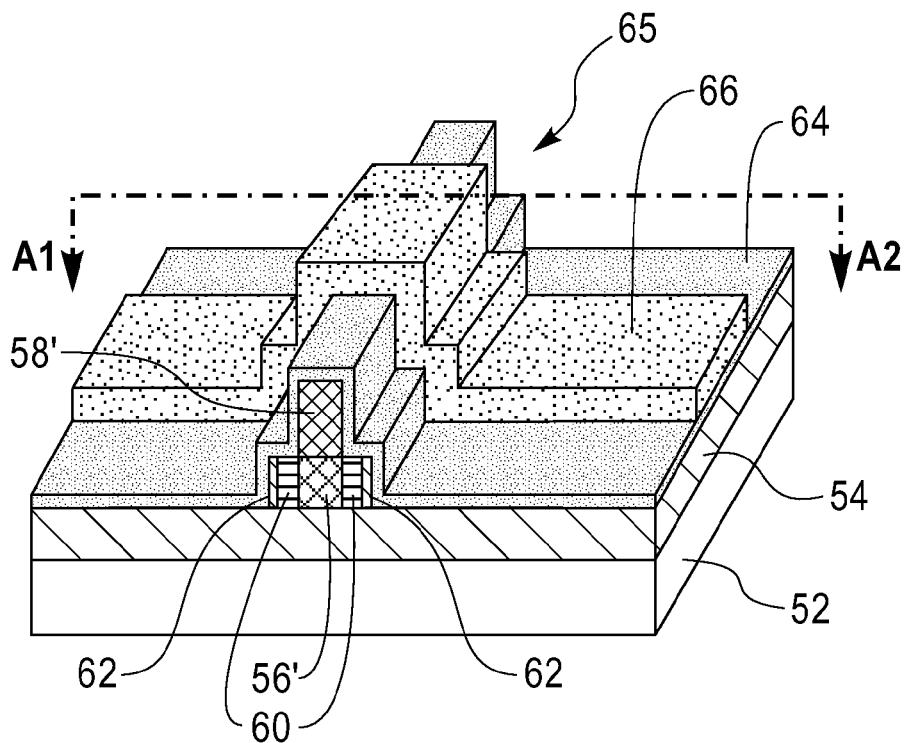
FIG. 13 is a three dimensional representation of the structure shown in FIG. 12 after forming a first gate structure including a first gate dielectric and a first gate conductor thereon.
Figure 14:
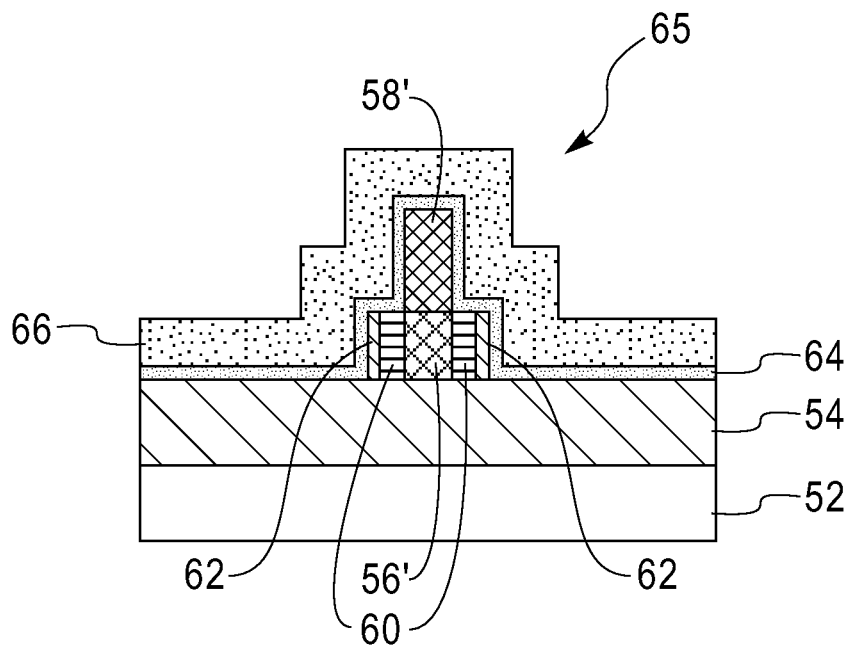
FIG. 14 is a cross sectional view of the structure shown in FIG. 13 taken along the A1-A2 plane.

Referring to FIGS. 13-14, there are illustrated the structure shown in FIG. 12 after forming a first gate structure 65 including a first gate dielectric 64 and a first gate conductor 66 thereon. The first gate dielectric 64 and the first conductor 66 shown in FIGS. 13 and 14 include materials and thicknesses mentioned above for forming the gate dielectric and the gate conductor 34 in the previous embodiment mentioned above. Also, the first gate dielectric 64 and the first gate conductor 66 shown in FIGS. 13 and 14 are formed utilizing one of the processes mentioned above in forming the gate dielectric and the gate conductor 34 in the previous embodiment of the present disclosure.

The structure illustrated in FIGS. 13-14 includes at least one silicon fin 56' located on a surface of a substrate i.e., the buried insulating layer 54 of the initial silicon-on-insulator substrate 50. The disclosed structure also includes a silicon carbide fin 60 located on each bare sidewall of the at least one silicon fin 56', and a graphene nanoribbon 62 located on a sidewall of each silicon carbide fin 60. The disclosed structure further includes a gate structure 65 oriented perpendicular to each silicon carbide fin 60 and the at least one silicon fin 56'. The gate structure 65 also overlaps a portion of each graphene nanoribbon 62 and is located atop a portion of each of the silicon carbide fins 60 and the at least one silicon fin 56'. The portion of the each graphene nanoribbon 62 overlapped by the gate structure 65 defines a channel region of the semiconductor structure.

Figure 15:
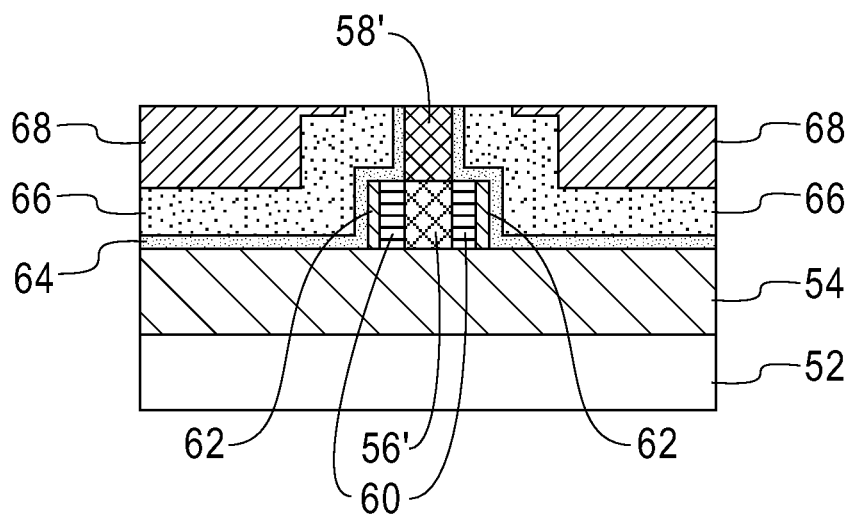
FIG. 15 is a pictorial representation (through a cross sectional view) illustrating the structure shown in FIG. 14 after forming a planarizing dielectric layer and planarizing the structure stopping on an upper surface of the patterned hard mask.

Referring now to FIG. 15, there is illustrated the structure shown in FIG. 14 after forming a planarizing dielectric layer 68 and planarizing the structure stopping on an upper surface of the patterned hard mask 58'. The planarizing dielectric layer 68 employed in this embodiment of the present disclosure may include a photoresist material, $SiO_2$, a doped silicate glass, a silsesquioxane, a C doped oxide (i.e., organosilicates) that include atoms of Si, C, O and H (SiCOH or porous pSiCOH), SiN, SiC:H, SiCN:H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The planarizing dielectric layer 68 can be formed utilizing any conventional deposition process including, for example, spin-on coating, chemical vapor deposition, chemical enhanced vapor deposition and chemical solution deposition. The thickness of the planarizing dielectric layer 68 that is formed prior to planarization varies so long as the upper surface of gate structure 65 that is located above the patterned hard mask 58' is covered with the planarizing dielectric material 68.

After forming the planarizing dielectric layer 68, the planarizing dielectric layer 68 is planarized stopping atop an upper surface of the patterned hard mask 58'. The planarizing step used in forming the structure shown in FIG. 15 can include chemical mechanical planarization and/or grinding. The planarization process provides a structure such as shown in FIG. 15 in which the upper surfaces of the planarizing dielectric layer 68, the first gate conductor 66, the hard mask 58' and the first gate dielectric 64 are each coplanar with each other.

Figure 16:
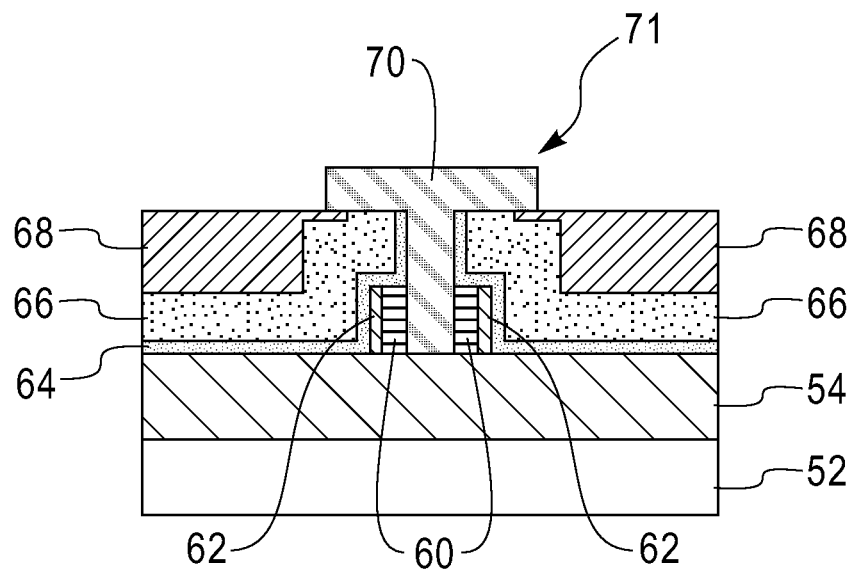
FIG. 16 is a pictorial representation (through a cross sectional view) illustrating the structure of FIG. 15 after selectively removing the patterned hard mask and the silicon fin from the structure, and formation of a second gate conductor in the area previously occupied by the patterned hard mask and the silicon fin.

Referring now to FIG. 16, there is shown the structure of FIG. 15 after selectively removing the patterned hard mask 58' and the silicon fin 56' from the structure, and formation of a second gate conductor 70 (the second gate conductor 70 represents a second gate line of the structure) in at least the area previously occupied by the patterned hard mask 58' and the silicon fin 56'.

The patterned hard mask 58' and the silicon fin 56' can be removed utilizing one or more selective etching processes. That is, the patterned hard mask 58' and the silicon fin 56' can be selectively removed utilizing a single etching step, or multiple etching steps can be used to selectively remove first the patterned hard mask 58' and then the silicon fin 56'. In one embodiment of the present disclosure, a wet etch can be used to selectively remove the patterned hard mask 58' from the structure, stopping atop the silicon fin 56', and thereafter RIE can be used to selectively remove the silicon fin 56' from the structure. More specifically an HBr based chemistry can be used to etch the silicon fin 56' selectively with respect to the planarizing dielectric material 68 and the first gate dielectric 64.

After selectively removing the patterned hard mask 58' and the silicon fin 56' from the structure, the second gate conductor 70 is formed in at least the area previously occupied by the patterned mask 58' and the silicon fin 64'; the second gate conductor 70 can also extend onto an upper surface of the first gate conductor 66 and an upper surface of the planarizing dielectric layer 68.

The second gate conductor 70 may comprise the same or different conductive material as the first gate conductor 66. Also, the gate conductor 70 can be formed utilizing one of the deposition processes mentioned above for the first gate conductor 66 and after deposition the deposited conductive material can be patterned by lithography and etching forming the second gate conductor 70 such as shown in FIG. 16. The structure shown in FIG. 16 is a double-gate FET with graphene channels.

Figure 17:
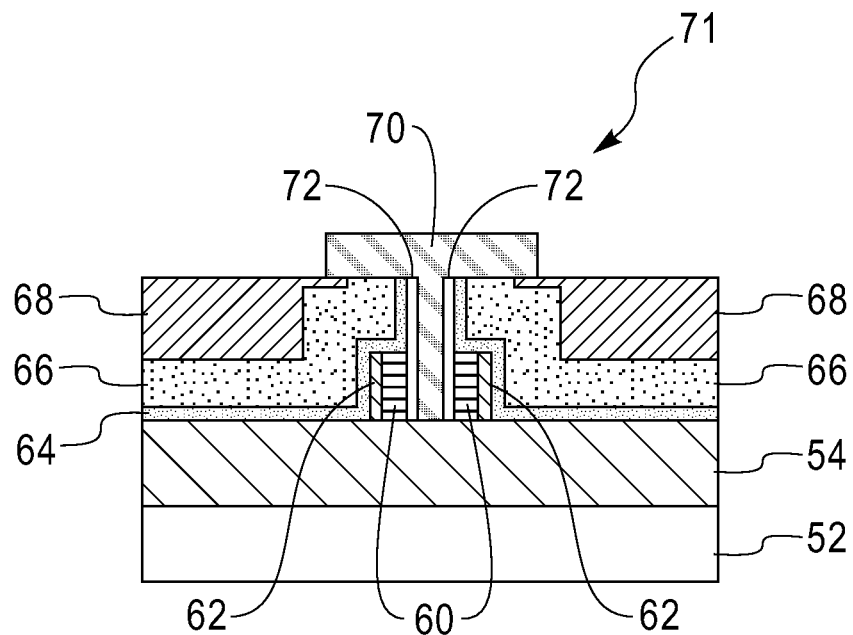
FIG. 17 is a pictorial representation (through a cross sectional view) illustrating the structure of FIG. 15 after selectively removing the patterned hard mask and the silicon fin from the structure, and formation of a second gate dielectric and a second gate conductor (i.e., a second gate structure) in the area previously occupied by the patterned hard mask and the silicon fin.

Reference is now made to FIG. 17, which represents another possible structure that can be formed utilizing the basic processing steps of this embodiment. Specifically, the structure shown in FIG. 15 is first formed and then the patterned hard mask 58' and the silicon fin 60' are selectively removed from the structure utilizing one or more etching process as described above in regard to the structure shown in FIG. 16. After selectively removing the patterned hard mask 58' and the silicon fin 56' from the structure, a second gate structure 71 including a second gate dielectric 72 and second gate conductor 70 is formed in at least the area previously occupied by the patterned hard mask 58' and the silicon fin 56'; a portion of second gate conductor 70 can extend onto an upper surface of the planarizing dielectric layer 68 and an upper surface of first gate conductor 66. The second gate dielectric 72 abuts sidewalls of each silicon carbide fin 60 and sidewalls of the first gate dielectric 64. Also, in this structure, a lower portion of the second gate conductor 70 abuts an upper surface of the buried insulating layer 54.

The second gate dielectric 72 can include one of the dielectric materials mentioned above for the first gate dielectric 64. In one embodiment, the second gate dielectric 72 is a different gate dielectric material than the first gate dielectric 64. In yet another embodiment, the second gate dielectric 72 and the first gate dielectric 64 are composed of the same dielectric material. The second gate dielectric 72 can be formed utilizing one of the process mentioned above that is used in forming the first gate dielectric 64.

The second gate conductor 70 can include one of the conductive materials mentioned above for the first gate conductor 66. In one embodiment, the second gate conductor 70 is a different conductive material than the first gate conductor 66. In yet another embodiment, the second gate conductor 70 and the first gate conductor 66 are composed of the same conductive material. The second gate conductor 70 can be formed utilizing the process mentioned above for forming the first gate conductor 66.

Figure 18A:
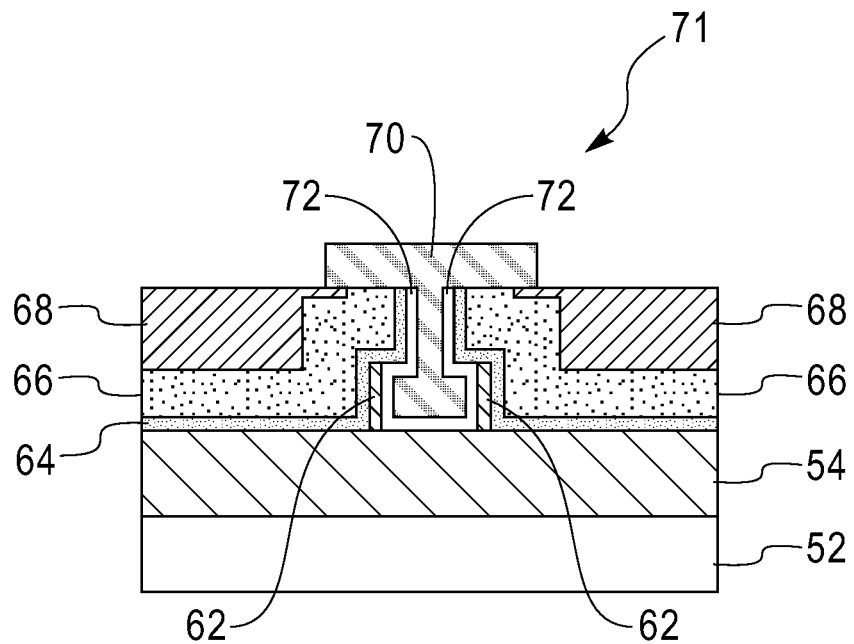
FIGS. 18A-18B are pictorial representations (through cross sectional views) illustrating the structure of FIG. 15 after selectively removing the patterned hard mask, the silicon fin and the silicon carbide fins from the structure and formation of a second gate dielectric and a second gate conductor (i.e., a second gate structure) in the area previously occupied by the patterned hard mask, the silicon fin and the silicon carbide fins.
Figure 18B:
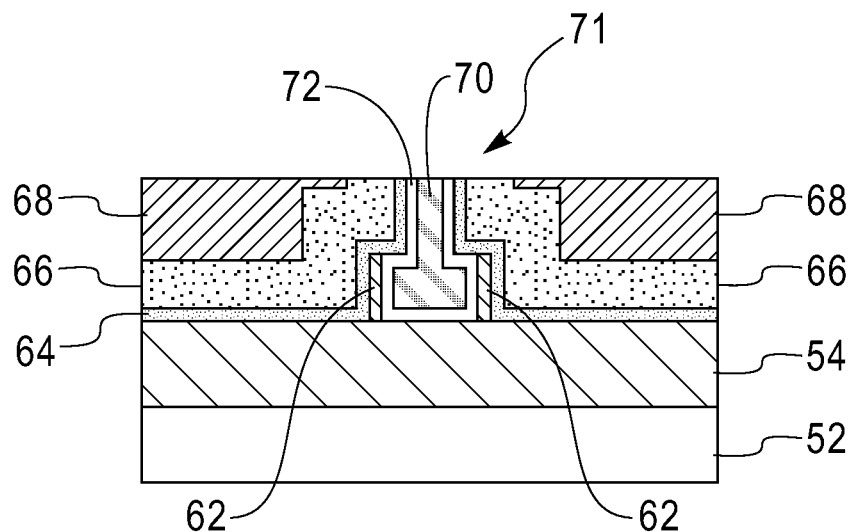

Reference is now made to FIGS. 18A-18B, which represent other possible structures that can be formed utilizing the basic processing steps of this embodiment. The structures shown in FIGS. 18A-18B are double gate FETs with graphene channels. In the embodiment depicted in FIG. 18A, the first and second gate conductors are electrically connected. In the embodiment depicted in FIG. 18B, the first and second gate conductors are not electrically connected. Both structure 18A and 18B can be formed by first providing the structure shown in FIG. 15. Next, the patterned hard mask 58' and the silicon fin 56' are selectively removed from the structure utilizing one or more etching processes as described above in regard to the structure shown in FIG. 16.

After selectively removing the patterned hard mask 58' and the silicon fin 56' from the structure, the silicon carbide fins 60 are selective removed from the structure utilizing an isotropic etching process such as, for example, hot phosphoric ($H_3PO_4$ at 180 C), or plasma etch with $SF_6$.

After selectively removing the silicon carbide fins 60 from the structure, a second gate structure 71 including a second gate dielectric 72 and a second gate conductor 70 is formed in at least the area previously occupied by the silicon carbide fins 60, the patterned hard mask 58' and the silicon fin 56'. In one embodiment and as shown in FIG. 18A, a portion of second gate conductor 70 can extend onto an upper surface of the planarizing dielectric layer 68 and an upper surface of first gate conductor 66. In the embodiment shown in FIG. 18A, the two gates are electrically connected. In another embodiment and as shown in FIG. 18B, the second gate conductor 70 does not extend onto the upper surface of at least the first gate conductor 66. In the embodiment shown in FIG. 18B, the two gates are electrically separated. In either structure, the second gate dielectric 72 abuts sidewalls of the graphene nanoribbons 62 and sidewalls of the first gate dielectric 64. Also, in these structures, the second gate dielectric 72 lies beneath the second gate conductor 70. As such, a lower portion of the second gate conductor 70 is separated from buried insulating layer 54 by a portion of the second gate dielectric 72.

The second gate dielectric 72 can include one of the dielectric materials mentioned above for the first gate dielectric 64. In one embodiment, the second gate dielectric 72 is a different gate dielectric material than the first gate dielectric 64. In yet another embodiment, the second gate dielectric 72 and the first gate dielectric 64 are composed of the same dielectric material. The second gate dielectric 72 can be formed utilizing one of the process mentioned above that is used in forming the first gate dielectric 64.

The second gate conductor 70 can include one of the conductive materials mentioned above for the first gate conductor 66. In one embodiment, the second gate conductor 70 is a different conductive material than the first gate conductor 66. In yet another embodiment, the second gate conductor and the first gate conductor 66 are composed of the same conductive material. The second gate conductor 70 can be formed utilizing the process mentioned above for forming the first gate conductor 66.

The structures shown in FIGS. 16-18A and 18B include at least one pair of spaced apart graphene nanoribbons located on a surface of a substrate, i.e., the buried insulating layer 54 of the original silicon-on-insulator substrate. This structure also includes a first gate structure 65 located on one sidewall of each spaced apart graphene nanoribbon, wherein the sidewalls of each graphene nanoribbon containing the first gate structure 65 are not facing each other. The structure further includes a planarizing dielectric material 68 located adjacent the first gate structure 65, and at least a gate conductor 70 of a second gate structure 71 located between the at least one pair of spaced apart graphene nanoribbons. In some embodiments, an upper portion of the second gate conductor 70 of the second gate structure 71 can contact an upper surface of the first gate structure 65, while in others the second gate conductor 70 does not contact an upper surface of the first structure 66.

Referring now to FIGS. 19A, 19B, 20A, 20B, 21A and 21B, there is illustrated another embodiment of the present disclosure in which carbon nanotubes are formed from silicon carbide nanowires. Specifically, this embodiment of the present disclosures provides a method of forming a gate-all-round carbon nanotube FET.

This embodiment begins by first providing the silicon carbide on-insulator substrate 10 shown in FIG. 1. Next, a plurality of suspended silicon carbide nanowires 80 is formed in at least one region of the structure providing a structure such as shown, for example, in FIGS. 19A-19B. Although a plurality of suspended silicon carbide nanowires oriented in a ladder type array arrangement is described and illustrated, the present application also contemplates an embodiment when a single suspended carbon nanowire is formed.

The suspended silicon carbide nanowires 80 are formed by lithography, etching and recessing portions of the buried insulating layer 14 from beneath each silicon carbide nanowire that is formed. Each suspended silicon carbide nanowire 80 has upper, lower and sidewalls surfaces that are bare. As is illustrated, the plurality of suspended silicon carbide nanowire 80 have a first end portion E1 that is in contact with a first unpatterned portion of the silicon carbide layer 16, and a second end portion E2 that is in contact with a second unpatterned portion of the silicon carbide layer 16. As also illustrated, the plurality of suspended silicon carbide nanowires 80 are arranged parallel to each other and a uniform space is present between each neighboring silicon carbide nanowire 80.

Figure 19A:
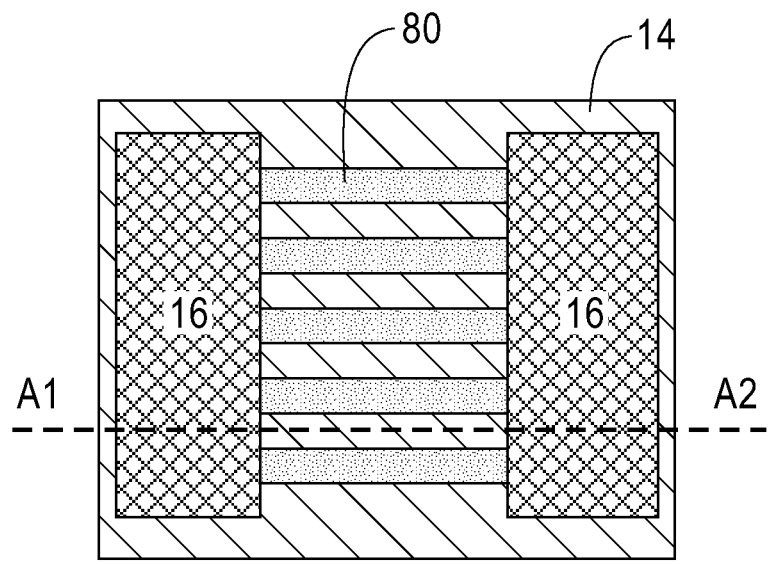
FIG. 19A is a pictorial representation (through a top down view) depicting the structure of FIG. 1 after forming a plurality of suspended silicon carbide nanowires located in at least one region of the structure.
Figure 19B:
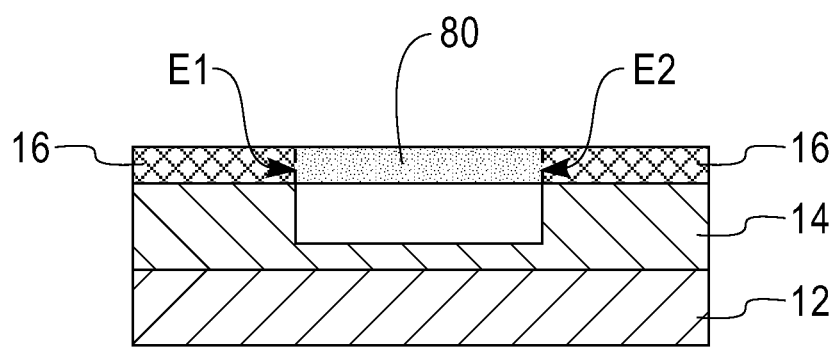
FIG. 19B is a cross sectional view of the structure shown in FIG. 19A through cut A1-A2.

As mentioned above, the structure shown in FIGS. 19A-19B can be formed by lithography and etching a plurality of unsuspended silicon carbide nanowires and thereafter removing portions of the buried insulating layer from beneath each unsuspended nanowire. Specifically, the structure shown in FIGS. 19A-19B is formed by first applying a photoresist material (not shown) to the upper surface of silicon carbide layer 16. The photoresist material, which can be a positive-tone material, a negative-tone material or a combination of both positive-tone and negative-tone materials, can be formed utilizing any conventional deposition including, for example, spin-on coating. Following the application of the photoresist material, the photoresist material is subjected to a desired pattern of radiation and thereafter the resist material is developed utilizing any conventional resist developer. With the patterned resist on the surface of the silicon carbide layer 16, the unprotected portions of silicon carbide layer 16 are then removed utilizing an etching process. The etching process can include dry etching or wet etching. When dry etching is employed, one of reactive ion etching, ion beam etching, and plasma etching can be used. When wet etching is employed, a chemical etchant that is selective in remove unprotected portions of the silicon carbide layer 16 can be used. In one embodiment, $SF_6$ based chemistry can be used to etch unprotected portions of the silicon carbide layer 16 not covered with the patterned resist. After patterning the silicon carbide layer 16, the patterned resist is removed utilizing a conventional resist removal processing such as ashing.

After forming the array of unsuspended silicon carbide nanowires, the buried insulating layer 14 beneath each carbon nanowire is removed utilizing an isotropic etching process such as, for example, a wet etch. More specifically, if the buried insulating layer 14 is $SiO_2$, then diluted HF (DHF) can be used to selectively undercut and suspend the nanowires.

Each suspended silicon carbide nanowire 80 that is formed has a length from 5 nm to 200 nm, with a length from 20 nm to 100 nm being more typical. The height of each suspended silicon carbide nanowire 80 is depended on the thickness of the original silicon carbide layer 16. The term "nanowire" as used throughout this application denotes a rectangular bar with a width and height dimensions that are several times smaller than the length dimension. Since the wire dimensions are typically in the nanometer scale it is referred to as a nanowire.

Figure 20A:
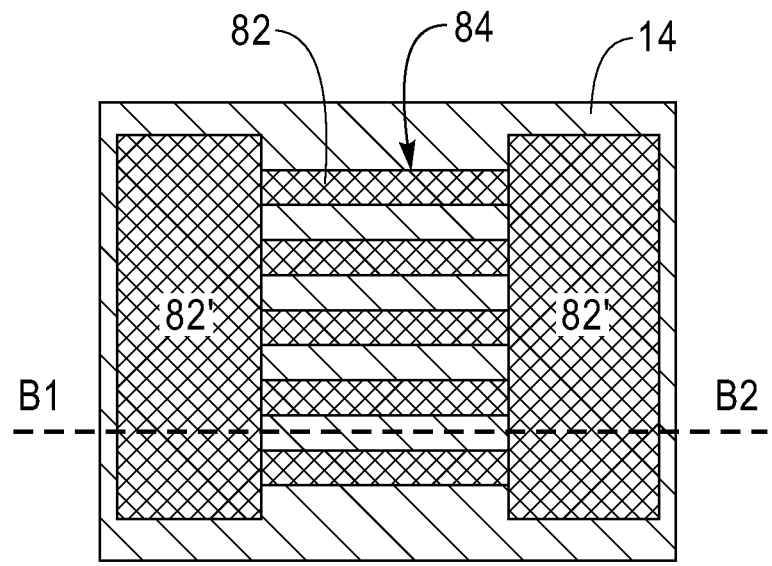
FIG. 20A is a pictorial representation (through a top down view) of the structure shown in FIG. 19A after forming a graphene coating on all exposed surfaces of the plurality of suspended silicon carbide nanowires; the nanowires coated with graphene may be referred to herein as carbon nanotubes.
Figure 20B:
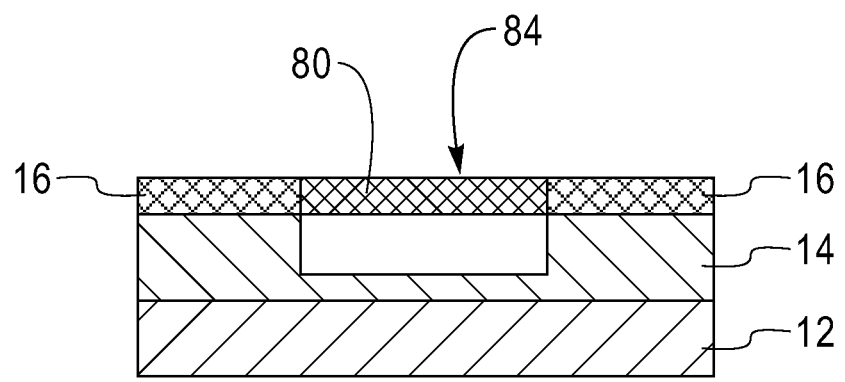
FIG. 20B is a side-view of the structure shown in FIG. 20A through cut A1-A2.

Referring now to FIGS. 20A-20B, there is shown the structure of FIGS. 19A-19B after forming a graphene coating 82 on all exposed surfaces of the plurality of suspended silicon carbide nanowires 80; the nanowires coated with graphene may be referred to herein as carbon nanotubes 84. It is also observed that a graphene coating 82' forms on the upper surface of the silicon carbide layer 16 which was previously not patterned into suspended silicon carbide nanowires 80. The areas including the silicon carbide layer 16 that is coated with graphene coating 82' can be processed into the source and drain regions of the structure. The area in which the source and drain regions are subsequently formed are labeled as element 88 in the subsequent drawings.

The graphene coating 82, 82' is formed utilizing the same technique mentioned above for forming graphene nanoribbon 32. That is, the exposed silicon carbide nanowire surfaces are first cleaned by annealing in a dilute silane ambient. After cleaning the exposed surfaces of the silicon carbide nanowires, a second anneal is used to form a graphene coating on all exposed silicon carbide surfaces.

Figure 21A:
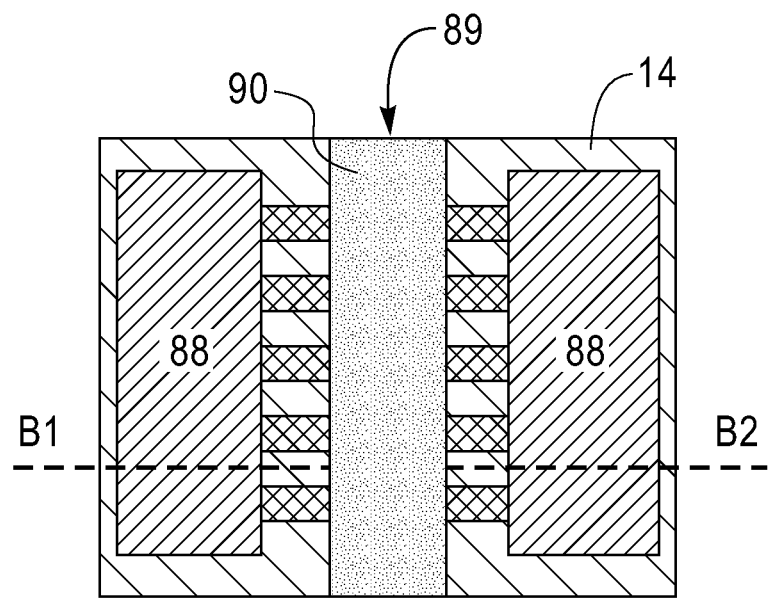
FIG. 21A is a pictorial representation (through a top down view) of the structure shown in FIG. 20A after forming a gate structure including a gate dielectric and a gate conductor over a portion of each carbon nanotube.
Figure 21B:
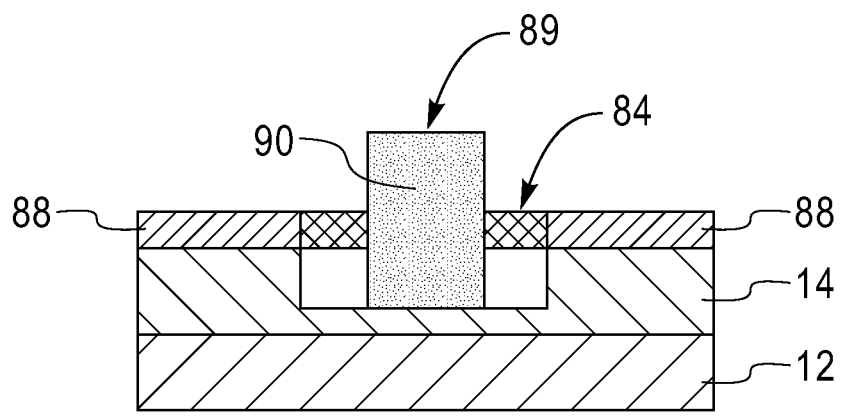
FIG. 21B is a side-view of the structure shown in FIG. 21A through cut A1-A2.

Referring now to FIGS. 21A-21B, there is illustrated the structure shown in FIGS. 20A-20B after forming a gate structure 89 including a gate dielectric (not shown) and a gate conductor 90 over a portion of each carbon nanotube 84. The gate dielectric employed in this embodiment can include one of the gate dielectric materials mentioned above in the regard to FIGS. 6A-6B. Also, gate conductor 90 can include one of the conductive material mentioned above for gate conductor 34. The gate dielectric and the gate conductor 90 of this embodiment can be formed utilizing one of the processes mentioned above for forming the gate dielectric and gate conductor 34 in FIGS. 6A-6B. The gate dielectric and the gate conductor are surrounding the suspended carbon nanotube and form a gate-all-around structure.

The structure shown in FIGS. 21A-22B include at least one suspended carbon nanotube 84 located atop a surface of a substrate, i.e., the buried insulator layer 14 of the initial silicon carbide-on-insulator substrate 10. The structure further includes a gate structure 89 oriented perpendicular to the at least one suspended carbon nanotube 84. The gate structure 89 also surrounds a portion of the at least one suspended carbon nanotube 84, and portions of the at least one carbon nanotube 84 surrounded by the gate structure 88 define a channel region of the semiconductor structure.

Source and drain regions 88 can be formed in the graphene regions over the non-patterned portions of the silicon carbide layer and the portion of the carbon nanotube that extends outside the gate region. The carbon nanotube outside the gate region and the graphene over the unpatterned SiC can be doped by chemical doping and can be reacted to form a metal carbide such as WC.

While the present disclosure has been particularly shown and described with respect to various embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A semiconductor structure comprising:
   at least one silicon carbide fin having a bottommost surface directly contacting a portion of an uppermost surface of an insulator layer;
   a graphene nanoribbon located on each bare sidewall of said at least one silicon carbide fin; and
   a gate structure oriented perpendicular to said at least one silicon carbide fin, said gate structure overlapping a portion of each graphene nanoribbon and located atop a portion of said at least one silicon carbide fin, wherein the portion of the each graphene nanoribbon overlapped by said gate structure defines a channel region of the semiconductor structure.

2. The semiconductor structure of claim 1 wherein said at least one silicon carbide fin comprises a plurality of parallel oriented silicon carbide fins, each silicon carbide fin of said plurality of parallel oriented silicon carbide fins having said graphene nanoribbon located on bare sidewalls thereof.

3. The semiconductor structure of claim 1 wherein each graphene nanoribbon has a width defined by a height of said at least one silicon carbide fin.

4. The semiconductor structure of claim 1 wherein one portion of each graphene nanoribbon not overlapped by said gate structure is a source region of the semiconductor structure, and wherein another portion of each graphene nanoribbon not overlapped by said gate structure is a drain region, and wherein said source region and said drain region are connected by the channel region.

5. The semiconductor structure of claim 4 wherein said source region and said drain region each include a metal carbide.

6. The semiconductor structure of claim 4 wherein said source region and said drain region are doped.

7. The semiconductor structure of claim 1 wherein one end of said at least one silicon carbide fin is in contact with a first silicon carbide layer portion and another end of said at least one silicon carbide fin is in contact with a second silicon carbide layer portion.

8. The semiconductor structure of claim 1 wherein said graphene nanoribbon is in direct physical contact with each bare sidewall of said at least one silicon carbide fin.

9. The semiconductor structure of claim 1 further comprising a hard mask located on an uppermost surface of said at least one silicon carbide fin.

10. The semiconductor structure of claim 1 wherein said graphene nanoribbon has a bottommost surface in direct contact with another portion of said insulator layer.

11. The semiconductor structure of claim 1 wherein said graphene nanoribbon has a 2D hexagonal crystallographic structure.

12. The semiconductor structure of claim 1 wherein said graphene nanoribbon comprises graphene having an amorphous carbon phase.

13. The semiconductor structure of claim 1 wherein said graphene nanoribbon comprises graphene having a disordered carbon phase.

14. The semiconductor structure of claim 1 wherein said graphene nanoribbon comprises graphene having an amorphous carbon phase and a disordered carbon phase.

15. The semiconductor structure of claim 1 wherein said graphene nanoribbon comprises graphene having at least one of substitutional dopant species, interstitial dopant species and intercalated dopant species.

16. The semiconductor structure of claim 1 further comprising a handle substrate located beneath said insulator layer.

17. The semiconductor structure of claim 1 wherein said insulator layer is an oxide, a nitride, or an oxynitride.

\* \* \* \* \*